(12) United States Patent
Morea et al.

(10) Patent No.: US 12,660,363 B2
(45) Date of Patent: Jun. 16, 2026

(54) ELECTROMAGNETIC RADIATION DETECTOR WITH REDUCED DARK CURRENT

(71) Applicant: Apple Inc., Cupertino, CA (US)

(72) Inventors: Matthew T. Morea, Cupertino, CA (US); Daniel Mahgerefteh, Campbell, CA (US); Romain F. Chevallier, Santa Clara, CA (US); Tomas Sarmiento, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 463 days.

(21) Appl. No.: 18/197,521

(22) Filed: May 15, 2023

(65) Prior Publication Data

US 2024/0047602 A1     Feb. 8, 2024

Related U.S. Application Data

(60) Provisional application No. 63/396,094, filed on Aug. 8, 2022.

(51) Int. Cl.
| | |
|---|---|
| *H10F 71/00* | (2025.01) |
| *H10F 30/24* | (2025.01) |
| *H10F 77/124* | (2025.01) |
| *H10F 77/14* | (2025.01) |
| *H10F 77/20* | (2025.01) |

(52) U.S. Cl.
CPC ......... *H10F 71/1272* (2025.01); *H10F 30/24* (2025.01); *H10F 77/1248* (2025.01); *H10F 77/148* (2025.01); *H10F 77/206* (2025.01)

(58) Field of Classification Search
CPC ............. H10F 71/1272; H10F 77/1248; H10F 77/148; H10F 77/206; H10F 77/147; H10F 77/14; H10F 39/103; H10F 30/24; H10F 30/288

See application file for complete search history.

(56) References Cited

U.S. PATENT DOCUMENTS

| | | | | |
|---|---|---|---|---|
| 4,794,439 A | * | 12/1988 | Webb | H10F 30/223 |
| | | | | 257/632 |
| 4,984,032 A | * | 1/1991 | Miura | H10F 77/1248 |
| | | | | 257/E31.022 |
| 4,999,696 A | | 3/1991 | Gentner et al. | |

(Continued)

FOREIGN PATENT DOCUMENTS

| | | | | |
|---|---|---|---|---|
| EP | 0901170 A1 | * | 3/1999 | ......... H10F 30/2215 |
| EP | 2918983 | | 9/2015 | |

(Continued)

OTHER PUBLICATIONS

Jones et al., "A Polarization Sensitive Bolometric Receiver for Observations of the Cosmic Microwave Background," SPIE, 4855-227-238, 2003.

(Continued)

*Primary Examiner* — Sitaramarao S Yechuri

(74) *Attorney, Agent, or Firm* — Brownstein Hyatt Farber Schreck, LLP

(57) ABSTRACT

An electromagnetic radiation detector includes one or more dark current isolation regions provided to position one or more PN junctions formed in the device away from areas that may exacerbate dark current when a depletion region is present.

20 Claims, 21 Drawing Sheets

(56) References Cited

U.S. PATENT DOCUMENTS

| | | | |
|---|---|---|---|
| 5,483,261 | A | 1/1996 | Yasutake |
| 5,488,204 | A | 1/1996 | Mead et al. |
| 5,825,352 | A | 10/1998 | Bisset et al. |
| 5,835,079 | A | 11/1998 | Shieh |
| 5,880,411 | A | 3/1999 | Gillespie et al. |
| 6,188,391 | B1 | 2/2001 | Seely et al. |
| 6,198,099 | B1 | 3/2001 | Kim |
| 6,310,610 | B1 | 10/2001 | Beaton et al. |
| 6,320,189 | B1 | 11/2001 | Ouvrier-Buffet |
| 6,410,917 | B1 | 6/2002 | Choi |
| 6,667,479 | B2 | 12/2003 | Ray |
| 6,690,014 | B1 | 2/2004 | Gooch |
| 6,690,387 | B2 | 2/2004 | Zimmerman et al. |
| 7,015,894 | B2 | 3/2006 | Morohoshi |
| 7,184,064 | B2 | 2/2007 | Zimmerman et al. |
| 7,227,145 | B2 | 6/2007 | Brouns |
| 7,268,349 | B2 | 9/2007 | Moon et al. |
| 7,405,403 | B2 | 7/2008 | Vilain |
| 7,450,246 | B2 | 11/2008 | Boesser et al. |
| 7,655,909 | B2 | 2/2010 | Schimert et al. |
| 7,663,607 | B2 | 2/2010 | Hotelling et al. |
| 7,825,379 | B2 | 11/2010 | Nakaki |
| 8,039,798 | B2 | 10/2011 | Oda |
| 8,441,094 | B2 | 5/2013 | Brueckl et al. |
| 8,513,605 | B2 | 8/2013 | Beratan |
| 8,530,933 | B2 | 9/2013 | Ogura |
| 8,610,070 | B2 | 12/2013 | Schimert et al. |
| 9,076,906 | B2 | 7/2015 | Ogura et al. |
| 9,163,998 | B2 | 10/2015 | Nam et al. |
| 9,243,959 | B2 | 1/2016 | Roh et al. |
| 9,411,055 | B2 | 8/2016 | Yoon et al. |
| 9,417,134 | B2 | 8/2016 | Koechlin et al. |
| 9,939,322 | B2 | 4/2018 | Kangas et al. |
| 10,323,987 | B2 | 6/2019 | Kangas et al. |
| 10,670,466 | B2 | 6/2020 | Kangas et al. |
| 10,900,841 | B2 | 1/2021 | Weiler et al. |
| 2004/0147068 | A1* | 7/2004 | Toyoda ................. H10F 39/014 |
| | | | 438/197 |
| 2006/0081768 | A1 | 4/2006 | Dutta |
| 2009/0101909 | A1* | 4/2009 | Chen ................... H10F 71/1212 |
| | | | 257/65 |
| 2010/0181601 | A1* | 7/2010 | Tabatabaie ........... H01S 5/0261 |
| | | | 257/E29.166 |
| 2012/0103406 | A1 | 5/2012 | Kayes et al. |
| 2015/0362374 | A1 | 12/2015 | Wheeler et al. |
| 2017/0077319 | A1* | 3/2017 | Cheng ................... H10F 77/413 |
| 2018/0247968 | A1* | 8/2018 | Na ...................... H10F 30/2218 |
| 2020/0194486 | A1* | 6/2020 | Na ...................... H10F 30/2823 |
| 2024/0250167 | A1* | 7/2024 | Okumura ........... H10D 30/0297 |

FOREIGN PATENT DOCUMENTS

| | | |
|---|---|---|
| JP | 2000163031 | 6/2000 |
| JP | 2002342033 | 11/2002 |
| JP | 2012099806 | 5/2012 |
| JP | 2013047658 | 3/2013 |
| JP | 2013530386 | 7/2013 |
| KR | 20060092879 | 8/2006 |
| KR | 100658114 | 12/2006 |
| KR | 20140075462 | 6/2014 |
| WO | WO 10/094051 | 8/2010 |
| WO | WO 16/112355 | 7/2016 |

OTHER PUBLICATIONS

U.S. Appl. No. 18/197,543, filed May 15, 2023, Morea et al.

* cited by examiner

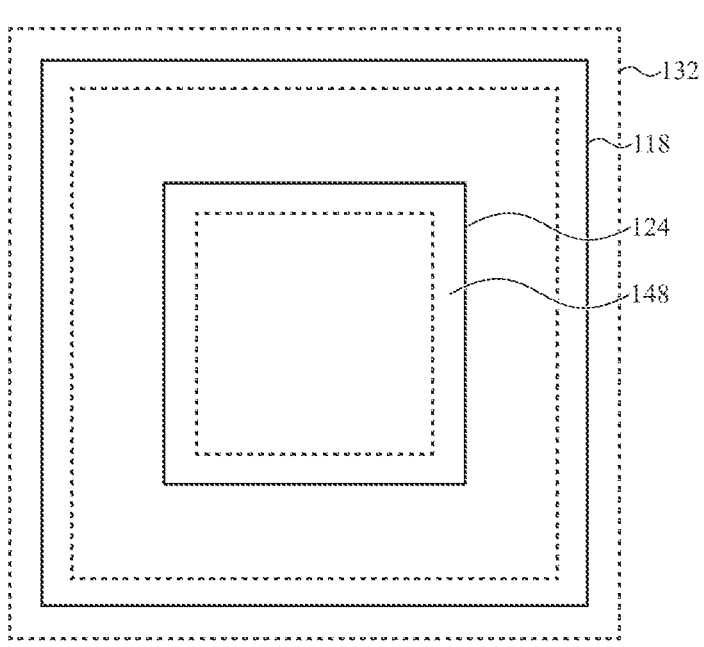
*FIG. 1B*

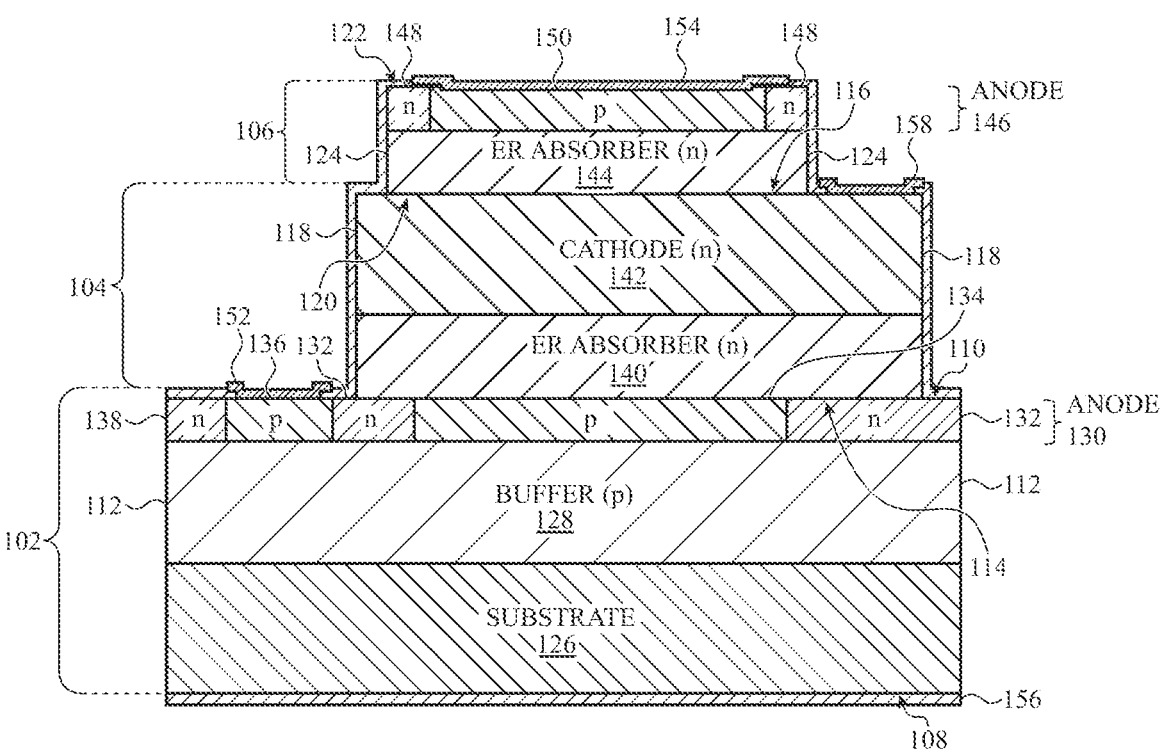
*FIG. 1C*

300

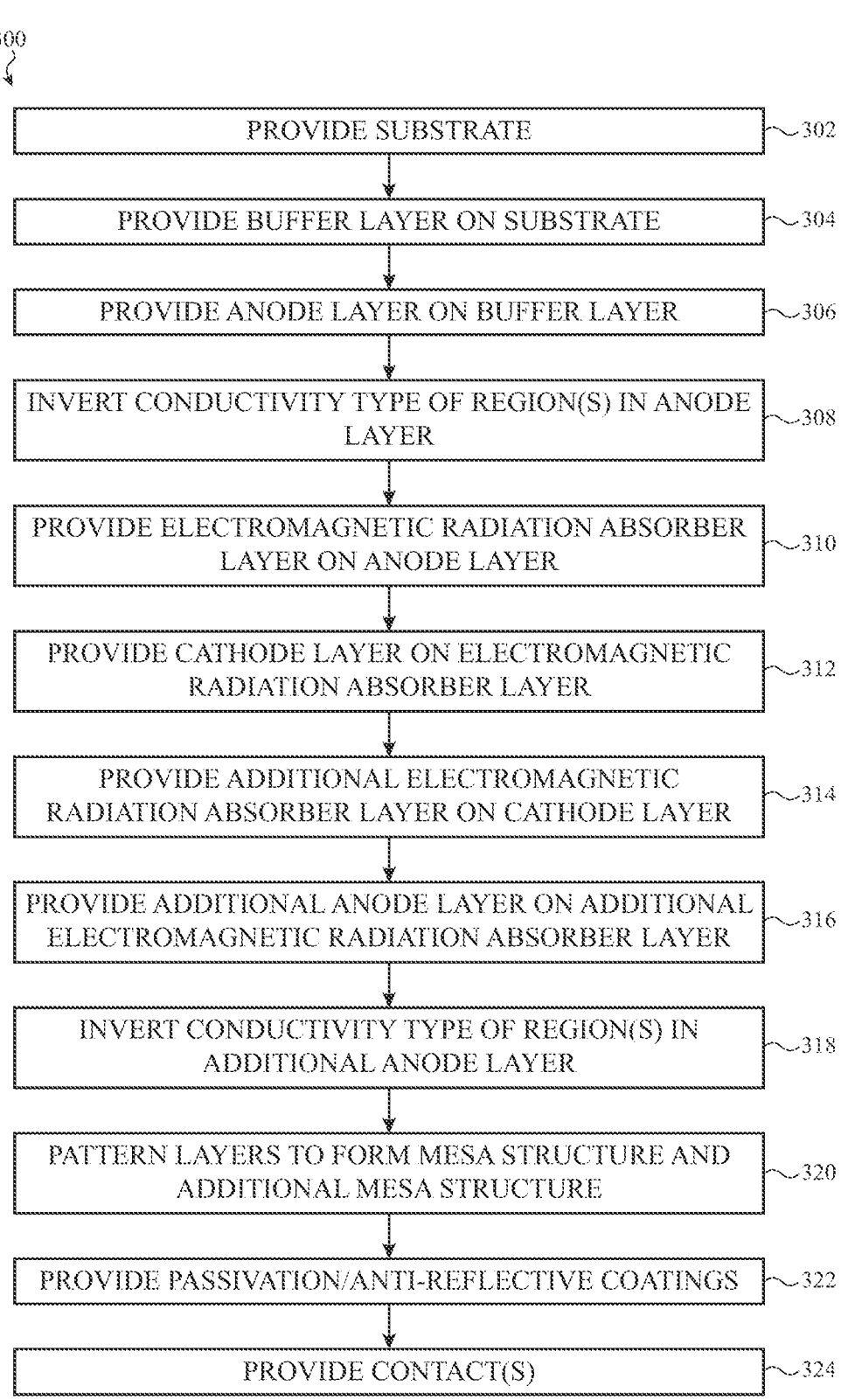

PROVIDE SUBSTRATE ~302

PROVIDE BUFFER LAYER ON SUBSTRATE ~304

PROVIDE ANODE LAYER ON BUFFER LAYER ~306

INVERT CONDUCTIVITY TYPE OF REGION(S) IN ANODE LAYER ~308

PROVIDE ELECTROMAGNETIC RADIATION ABSORBER LAYER ON ANODE LAYER ~310

PROVIDE CATHODE LAYER ON ELECTROMAGNETIC RADIATION ABSORBER LAYER ~312

PROVIDE ADDITIONAL ELECTROMAGNETIC RADIATION ABSORBER LAYER ON CATHODE LAYER ~314

PROVIDE ADDITIONAL ANODE LAYER ON ADDITIONAL ELECTROMAGNETIC RADIATION ABSORBER LAYER ~316

INVERT CONDUCTIVITY TYPE OF REGION(S) IN ADDITIONAL ANODE LAYER ~318

PATTERN LAYERS TO FORM MESA STRUCTURE AND ADDITIONAL MESA STRUCTURE ~320

PROVIDE PASSIVATION/ANTI-REFLECTIVE COATINGS ~322

PROVIDE CONTACT(S) ~324

*FIG. 3*

100
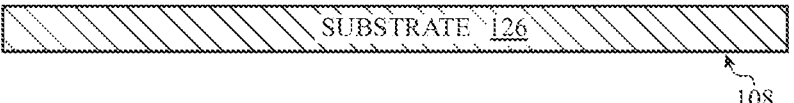
108
*FIG. 4A*

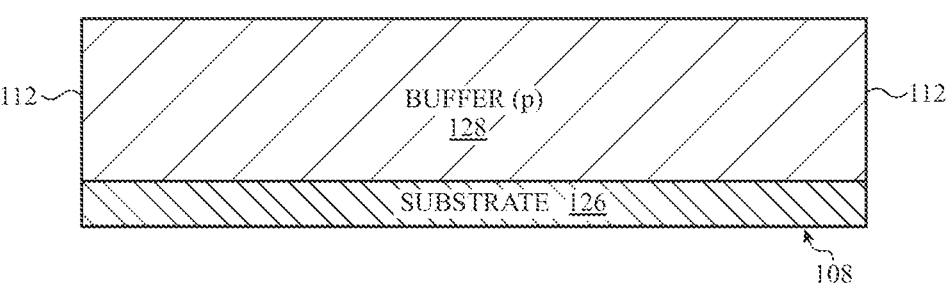
*FIG. 4B*

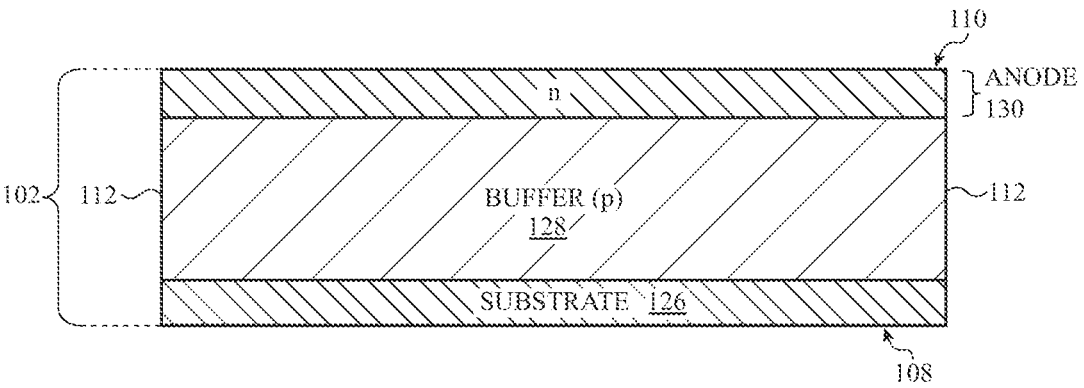
*FIG. 4C*

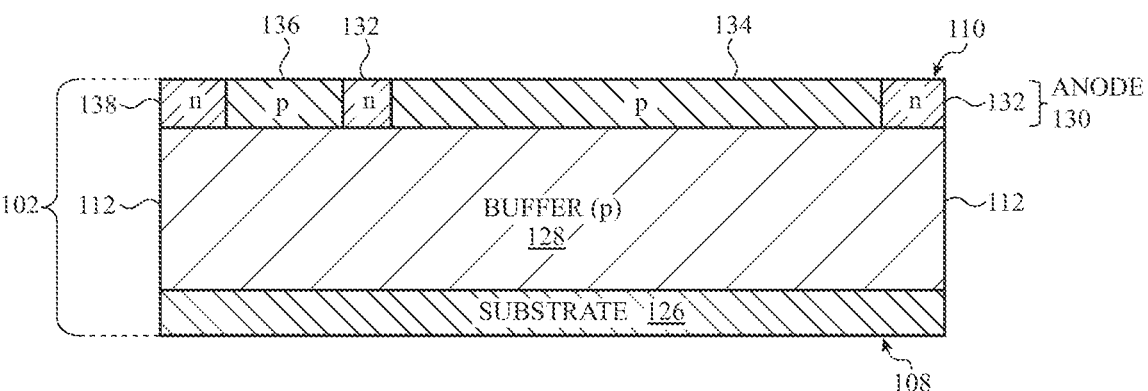
*FIG. 4D*

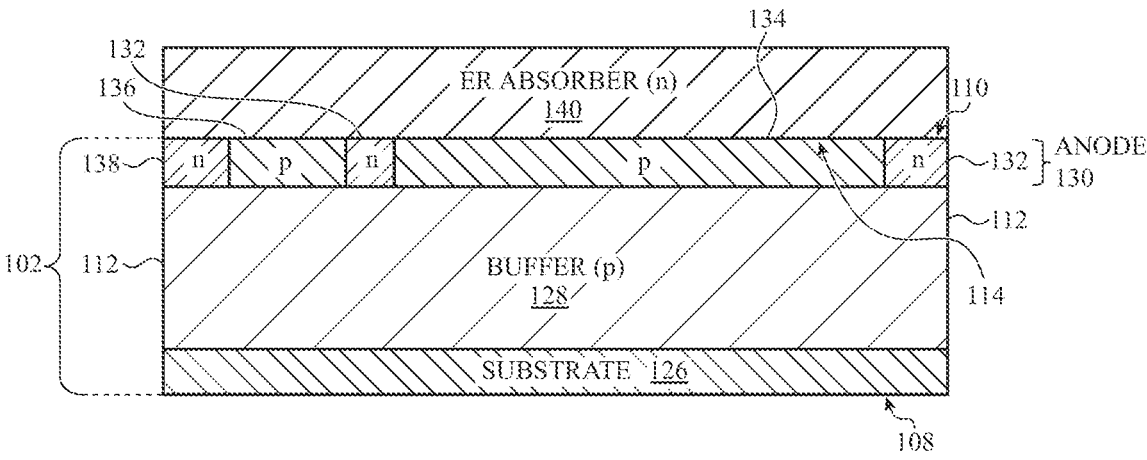
*FIG. 4E*

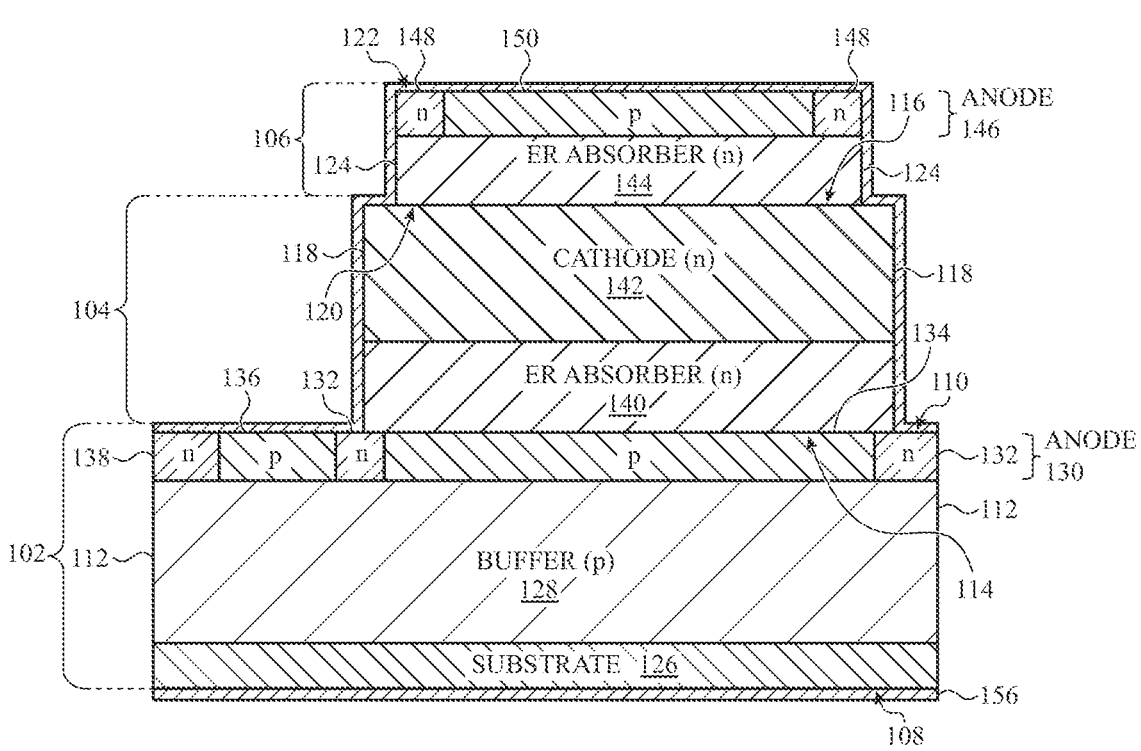
*FIG. 4K*

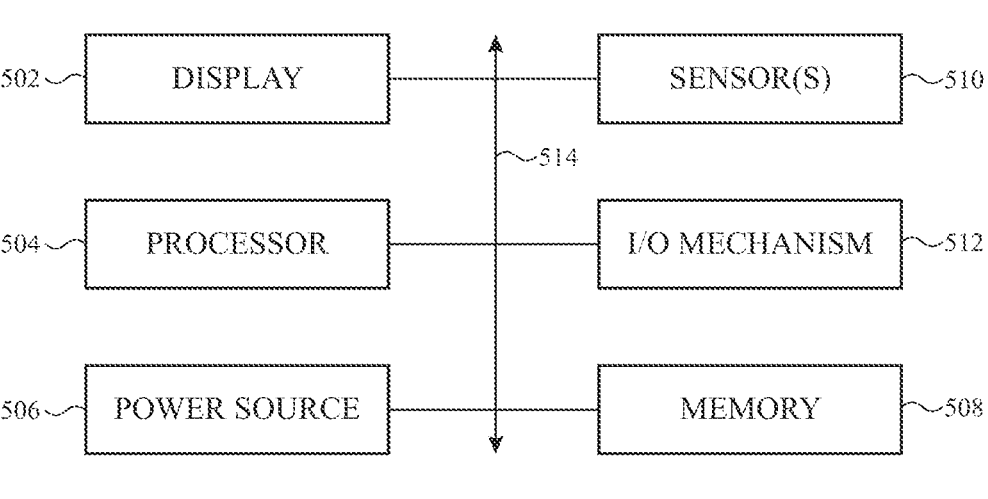
*FIG. 6*

ELECTROMAGNETIC RADIATION DETECTOR WITH REDUCED DARK CURRENT

CROSS-REFERENCE TO RELATED APPLICATION

This application is a nonprovisional and claims the benefit under 35 U.S.C. § 119(e) of U.S. Provisional Patent Application No. 63/396,094, filed Aug. 8, 2022, the contents of which are incorporated herein by reference as if fully disclosed herein.

TECHNICAL FIELD

The described embodiments relate to the detection of electromagnetic radiation and, in particular, to electromagnetic radiation detectors having reduced dark current.

BACKGROUND

Sensors are included in many of today's electronic devices, including electronic devices such as smartphones, computers (e.g., tablet computers or laptop computers), wearable electronic devices (e.g., electronic watches, smart watches, or health monitors), and so on. Sensors may variously sense the presence of objects, distances to objects, proximities of objects, movement of objects (e.g., whether objects are moving, or the speed, acceleration, or direction of movement of objects), compositions of objects, and so on. Electromagnetic radiation detectors (also referred to as electromagnetic radiation sensors, optical sensors, and optical detectors) are commonly used in sensors to detect light (e.g., visible and/or infrared light) collected or otherwise received by the sensor. Dark current that occurs in these electromagnetic radiation detectors may limit the signal-to-noise ratio (SNR) of measurements taken by the detector, and thus it would be desirable to provide electromagnetic radiation detectors with reduced dark current.

SUMMARY

Embodiments described herein relate to electromagnetic radiation detectors and methods for manufacturing electromagnetic radiation detectors. In one embodiment, a method for manufacturing an electromagnetic radiation detector may include providing a base structure. The base structure may define a first surface, a second surface opposite the first surface, and a sidewall between the first surface and the second surface. Providing the base structure may include providing an anode layer defining a second surface of the base structure, inverting a conductivity type of one or more regions in the anode layer such that the anode layer includes a dark current isolation region having a first conductivity type and a conduction region having a second conductivity type opposite the first conductivity type. After inverting the conductivity type of the one or more regions in the anode layer, a mesa layer stack may be provided on the base structure. Providing the mesa layer stack may include providing an electromagnetic radiation absorber layer having the first conductivity type on the second surface of the base structure. The mesa layer stack may then be patterned to provide a mesa structure, which defines a first surface disposed on the second surface of the base structure, a second surface opposite the first surface, and a sidewall between the first surface and the second surface. The electromagnetic radiation absorber layer may define a portion of the sidewall of the mesa structure. The sidewall of the mesa structure may be in contact with the dark current isolation region of the anode layer at the second surface of the base structure. An interior portion of the mesa structure may be in contact with the conduction region of the anode layer at the second surface of the base structure.

In one embodiment, inverting the conductivity type of the one or more regions in the anode layer includes providing a patterned mask on the surface of the anode layer, introducing a dopant through one or more openings in the patterned mask to invert the conductivity type of the one or more regions, and removing the patterned mask from the surface of the anode layer. The dopant may be introduced via one of an ion implantation process and a diffusion doping process.

In one embodiment, the conductivity type of the one or more regions in the anode layer may be inverted such that the anode layer further comprises a contact region adjacent the dark current isolation region between the sidewall of the base structure and the sidewall of the mesa structure, where the contact region has the second conductivity type. In one embodiment, the conductivity type of the one or more regions in the anode layer may be inverted such that the anode layer further comprises an additional dark current isolation region between the contact region and the sidewall of the base structure.

In one embodiment, providing the mesa layer stack may further include providing a cathode layer on a surface of the electromagnetic radiation absorber layer opposite the base structure. The cathode layer may have the first conductivity type. Further, providing the base structure may further include providing a substrate that defines the first surface of the base structure and has the second conductivity type, and providing a buffer layer on a surface of the substrate opposite the first surface of the base structure. The anode layer may be provided on a surface of the buffer layer such that the buffer layer is between the substrate and the anode layer. The buffer layer may have the second conductivity type.

In one embodiment, an additional mesa layer stack is provided on the second surface of the mesa structure. The additional mesa layer stack may include an additional electromagnetic radiation absorber layer on the second surface of the mesa structure and an additional anode layer on a surface of the additional electromagnetic radiation absorber layer opposite the mesa structure. The additional electromagnetic radiation absorber layer may have the first doping type. The additional mesa layer stack may be patterned to provide an additional mesa structure defining a first surface disposed on the second surface of the mesa structure, a second surface opposite the first surface, and a sidewall between the first surface and the second surface. A conductivity type of one or more regions in the additional anode layer may be inverted such that the additional anode layer includes a dark current isolation region in contact with the sidewall of the additional mesa structure and a conduction region in contact with an interior portion of the additional electromagnetic radiation absorber layer. The dark current isolation region may have the first conductivity type, and the conduction region may have the second conductivity type.

In one embodiment, the substrate may comprise indium phosphide (InP). The buffer layer, the anode layer, the cathode layer, and the additional anode layer may comprise indium arsenide phosphide (InAsP). The first electromagnetic radiation absorber layer and the second electromagnetic radiation absorber layer may comprise indium gallium arsenide (InGaAs).

In one embodiment, an electromagnetic radiation detector may include a mesa structure on a base structure. The mesa structure may define a first surface, a second surface opposite the first surface, and a sidewall between the first surface and the second surface. The mesa structure may include an electromagnetic radiation absorber layer defining the first surface of the mesa structure and defining a portion of the sidewall. The electromagnetic radiation absorber layer may have a first conductivity type. The base structure may also define a first surface, a second surface opposite the first surface, and a sidewall between the first surface and the second surface. The first surface of the mesa structure may be disposed on the second surface of the base structure. The base structure may include an anode layer, which may in turn include a dark current isolation region and a conduction region. The dark current isolation region may be in contact with the sidewall of the mesa structure at the second surface of the base structure and may have the first conductivity type. The conduction region may be in contact with an interior portion of the mesa structure at the second surface of the base structure and have a second conductivity type opposite the first conductivity type.

In one embodiment, the anode layer may further include a contact region adjacent the dark current isolation region between the sidewall of the base structure and the sidewall of the mesa structure. The contact region may have the second conductivity type. In one embodiment, the electromagnetic radiation detector may further include an additional dark current isolation region between the contact region and the sidewall of the base structure. The additional dark current isolation region may have the first conductivity type.

In one embodiment, the mesa structure further includes a cathode layer disposed on a surface of the electromagnetic radiation absorber layer opposite the base structure. The cathode layer may define the second surface of the mesa structure and may have the first conductivity type. The base structure may further include a substrate and a buffer layer. The substrate may define the first surface of the base structure and have the second conductivity type. The buffer layer may be between the substrate and the anode layer and have the second conductivity type.

In one embodiment, the electromagnetic radiation detector further includes an additional mesa structure. The additional mesa structure may define a first surface disposed on the second surface of the mesa structure, a second surface opposite the first surface, and a sidewall between the first surface and the second surface. The additional mesa structure may include an additional electromagnetic radiation absorber layer and an additional anode layer. The additional electromagnetic radiation absorber layer may define the first surface of the additional mesa structure and have the first conductivity type. The additional anode layer may be disposed on a surface of the additional electromagnetic radiation absorber layer opposite the mesa structure and define a second surface of the additional mesa structure. The additional anode layer may include a dark current isolation region and a conduction region. The dark current isolation region may be in contact with the sidewall of the additional mesa structure and have the first conductivity type. The conduction region may be in contact with an interior portion of the additional electromagnetic radiation absorber layer and have the second conductivity type.

In one embodiment, the substrate may comprise InP. The buffer layer, the anode layer, the cathode layer, and the additional anode layer may comprise InAsP. The first electromagnetic radiation absorber layer and the second electromagnetic radiation absorber layer may comprise InGaAs.

In one embodiment, a method for manufacturing an electromagnetic radiation detector defining a first surface, a second surface opposite the first surface, and a sidewall between the first surface and the second surface may include providing an anode layer and inverting a conductivity type of one or more regions in the anode layer. The conductivity of the one or more regions in the anode layer may be inverted such that the anode layer includes a dark current isolation region and a conduction region. The dark current isolation region may be in contact with the sidewall and have a first conductivity type. The conduction region may be in contact with an interior portion of the anode layer and have a second conductivity type opposite the first conductivity type. After inverting the conductivity type of the one or more regions in the anode layer, an electromagnetic radiation absorber layer may be provided on the surface of the anode layer. The electromagnetic radiation absorber layer may define at least a portion of the sidewall, and may be in contact with the conduction region of the anode layer. The electromagnetic radiation layer may have the first conductivity type.

In one embodiment, inverting the conductivity type of the one or more regions in the anode layer may include providing a patterned mask on the surface of the anode layer, introducing a dopant into the anode layer through one or more openings in the patterned mask to invert the conductivity type of the one or more regions, and removing the patterned mask.

In one embodiment, a substrate having the second conductivity type is provided. The substrate may define the first surface. A buffer layer is provided on a surface of the substrate opposite the first surface. The anode layer may be provided on a surface of the buffer layer such that the buffer layer is between the substrate and the anode layer. The buffer layer may have the second conductivity type. A cathode layer may be provided on a surface of the electromagnetic radiation absorber layer opposite the anode layer. The cathode layer may have the first conductivity type. An additional electromagnetic radiation absorber layer may be provided on a surface of the cathode layer opposite the electromagnetic radiation absorber layer. The additional electromagnetic radiation absorber layer may have the first conductivity type. An additional anode layer may be provided on a surface of the additional electromagnetic radiation absorber layer opposite the cathode layer.

In one embodiment, the conductivity type of one or more regions in the additional anode layer may be inverted such that the additional anode layer includes a dark current isolation region and a conduction region. The dark current isolation region may be in contact with the sidewall and have the first conductivity type. The conduction region may be in contact with an interior portion of the additional electromagnetic radiation absorber layer and have the second conductivity type.

In one embodiment, the substrate may comprise InP. The buffer layer, the anode layer, the cathode layer, and the additional anode layer may comprise InAsP. The first electromagnetic radiation absorber layer and the second electromagnetic radiation absorber layer may comprise InGaAs.

BRIEF DESCRIPTION OF THE DRAWINGS

Reference will now be made to representative embodiments illustrated in the accompanying figures. It should be understood that the following descriptions are not intended to limit this disclosure to one included embodiment. To the contrary, the disclosure provided herein is intended to cover alternatives, modifications, and equivalents as may be included within the spirit and scope of the described embodiments, and as defined by the appended claims.

FIG. 1B illustrates a top-down view illustrating certain aspects of the electromagnetic radiation detector of FIG. 1A.

FIG. 1C illustrates a cross-sectional view of an electromagnetic radiation detector, such as described herein.

FIG. 3 is a flowchart depicting example operations of a method for manufacturing an electromagnetic radiation detector, such as described herein.

FIGS. 4A through 4L illustrate the example operations of the method for manufacturing the electromagnetic radiation detector of FIG. 1A.

FIG. 6 illustrates an electrical block diagram of an electronic device that may include an electromagnetic radiation detector, such as described herein.

The use of the same or similar reference numerals in different figures indicates similar, related, or identical items.

Figure 1A:
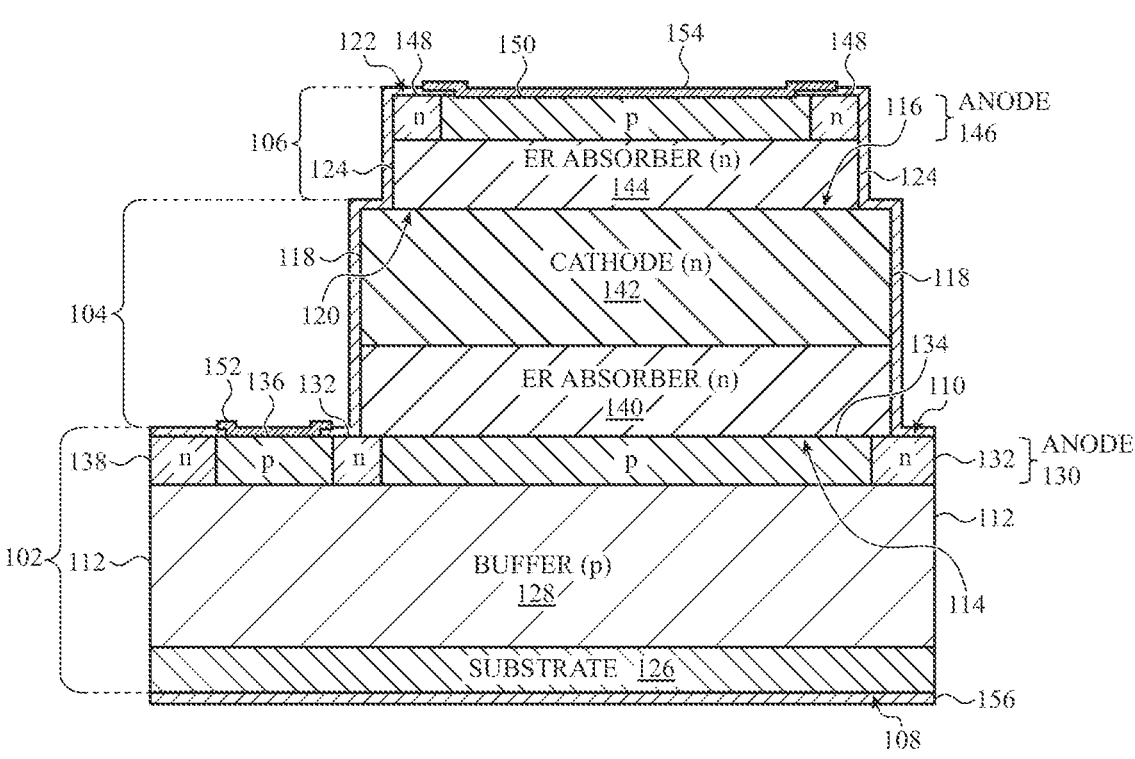
FIG. 1A illustrates a cross-sectional view of an electromagnetic radiation detector, such as described herein.

The use of cross-hatching or shading in the accompanying figures is generally provided to clarify the boundaries between adjacent elements and also to facilitate legibility of the figures. Accordingly, neither the presence nor the absence of cross-hatching or shading conveys or indicates any preference or requirement for particular materials, material properties, element proportions, element dimensions, commonalities of similarly illustrated elements, or any other characteristic, attribute, or property for any element illustrated in the accompanying figures.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein relate to electromagnetic radiation detectors and methods for manufacturing electromagnetic radiation detectors. In particular, embodiments described herein relate to electromagnetic radiation detectors having reduced dark current and thus improved performance. Electromagnetic radiation detectors (e.g., optical sensors) may be used in many modern electronic devices such as smartphones, tablets, and wearable devices (e.g., smart watches) to detect light received thereby. Light measured by these sensors may be used to determine myriad physical phenomena such as proximity, brightness, and biometric data (e.g., heart rate, blood oxygenation).

Some applications of electromagnetic radiation detectors may demand higher performance than others. For example, some applications may require an SNR above a target threshold. One source of noise in electromagnetic radiation detectors is dark current. Dark current refers to the current that flows through an electromagnetic radiation detector even when no radiation (e.g., photons) are entering the detector. Dark current may be caused by the random generation of electrons and holes in a depletion region of an electromagnetic radiation detector, and may be exacerbated by crystallographic defects within or near a depletion region of the device. The electromagnetic radiation detectors described herein, and the manufacturing processes to achieve them, are configured to reduce dark current and thus improve performance.

Embodiments of the present disclosure contemplate providing one or more dark current isolation regions that are in contact with a mesa edge (i.e., sidewall) in an electromagnetic radiation detector. These dark current isolation regions define a boundary of a PN junction in the electromagnetic radiation detector such that the PN junction is distanced from a mesa edge. Moving a PN junction away from a mesa edge may reduce dark current by preventing a depletion region formed in the PN junction from interacting with crystallographic defects that are concentrated at or near the mesa edge.

These and other embodiments are discussed below with reference to FIGS. 1A-6. However, those skilled in the art will readily appreciate that the detailed description given herein with respect to these figures is for explanation only and should not be construed as limiting.

FIG. 1A shows a cross-sectional view of an electromagnetic radiation detector 100 according to one embodiment of the present disclosure. The electromagnetic radiation detector 100 may include a base structure 102, a mesa structure 104, and an additional mesa structure 106. The base structure may define a first surface 108, a second surface 110, and a sidewall 112 between the first surface 108 and the second surface 110. Similarly, the mesa structure 104 may define a first surface 114 on the second surface 110 of the base structure 102, a second surface 116 opposite the first surface 114, and a sidewall 118 between the first surface 114 and the second surface 116. The additional mesa structure 106 may also define a first surface 120 on the second surface 116 of the mesa structure 104, a second surface 122 opposite the first surface 120, and a sidewall 124 between the first surface 120 and the second surface 122.

The base structure 102 may include a substrate 126, an optional buffer layer 128, and an anode layer 130. A surface of the substrate 126 (i.e., a bottom surface of the substrate 126) may define the first surface 108 of the base structure 102. A surface of the anode layer 130 (i.e., a top surface of the anode layer 130) may define the second surface 110 of the base structure 102. The buffer layer 128 may be between the substrate 126 and the anode layer 130, and may provide a gradual transition between a lattice constant of the substrate 126 and a lattice constant of the anode layer 130. The buffer layer 128 may be omitted in certain embodiments. The anode layer 130 may include several regions having different conductivity types therein. In particular, the anode layer 130 may include one or more dark current isolation regions 132, a conduction region 134, a contact region 136, and one or more additional dark current isolation regions 138. While shown in FIG. 1A as being separated by the conduction region 134 and the contact region 136, the one or more dark current isolation regions 132, as well as the one or more additional dark current isolation regions 138 may, in various embodiments, be a single region that is connected in a plane not shown in the cross-sectional view of FIG. 1A. In some embodiments, the one or more dark current isolation regions 132 will contact the entirety of the sidewall 118 of the mesa structure 104, which is a three-dimensional structure. Accordingly, the one or more dark current isolation regions 132 may be provided as a rectangular ring, a circular ring, a polygonal ring, or any other suitable shape as viewed looking down from a top of the electromagnetic radiation detector 100. Such a top-down view illustrating the relationship between the sidewall 118 of the mesa structure 104 and the one or more dark current isolation regions 132 is shown in FIG. 1B, the details of which are discussed later. While referred to herein as an anode layer 130, those skilled in the art will appreciate that the entirety of the layer does not comprise an anode. Rather, the anode layer 130 contains one or more regions that form an anode, which are defined by the conduction region 134.

The mesa structure 104 may include an electromagnetic radiation absorber layer 140 and a cathode layer 142. A surface of the electromagnetic radiation (ER) absorber layer 140 (i.e., a bottom surface of the electromagnetic radiation absorber layer 140) may define the first surface 114 of the mesa structure 104 and thus be disposed on the anode layer 130. In particular, an interior portion of the electromagnetic radiation absorber layer 140 may be in contact with the conduction region 134 of the anode layer 130 to form a PN junction, while an outer portion of the electromagnetic radiation absorber layer 140, and in particular a portion of the electromagnetic radiation absorber layer 140 defining the sidewall 118 of the mesa structure 104, is in contact with the dark current isolation region 132 of the anode layer 130. The dark current isolation region 132 limits the PN junction formed between the anode layer 130 and the electromagnetic radiation absorber layer 140 to an interior portion of the mesa structure 104 away from the sidewall 118 thereof. Since the etching process used to create the mesa structure 104 may result in crystallographic defects at the sidewall 118 thereof, the dark current isolation regions 132 may effectively divert a depletion region formed in the device away from these defects and thus reduce dark current in the electromagnetic radiation detector 100. Notably, the electromagnetic radiation absorber layer 140 may have a uniform conductivity type throughout the entire electromagnetic radiation absorber layer 140 (i.e., from sidewall 118 to sidewall 118 in the mesa structure 104) such that the electromagnetic radiation absorber layer 140 defines a portion of the sidewall 118. The cathode layer 142 may be on a surface of the electromagnetic radiation absorber layer 140 opposite the base structure 102 such that a surface of the cathode layer 142 (i.e., a top surface of the cathode layer 142) defines the second surface 116 of the mesa structure 104.

The additional mesa structure 106 may include an additional electromagnetic radiation absorber layer 144 and an additional anode layer 146. A surface of the additional electromagnetic radiation absorber layer 144 (i.e., a bottom surface of the additional electromagnetic radiation absorber layer 144) may define the first surface 120 of the additional mesa structure 106 and thus be disposed on the cathode layer 142. Notably, the additional electromagnetic radiation absorber layer 144 may have a uniform conductivity type throughout the entirety of the additional electromagnetic radiation absorber layer 144 (i.e., from sidewall 124 to sidewall 124 of the additional mesa structure 106) such that the additional electromagnetic radiation absorber layer 144 defines a portion of the sidewall 124. The additional anode layer 146 may be on a surface of the additional electromagnetic radiation absorber layer 144 opposite the mesa structure 104. The additional anode layer 146 may include one or more dark current isolation regions 148 and a conduction region 150. The one or more dark current isolation regions 148 may be in contact with the sidewall of the additional mesa structure 106. While shown in FIG. 1A as being separated by the conduction region 150, the one or more dark current isolation regions 148 may be a single region that is connected in a plane not shown in the cross-sectional view of FIG. 1A. In some embodiments, the one or more dark current isolation regions 148 will contact the entirety of the sidewall 124 of the additional mesa structure 106, which is a three-dimensional structure. Accordingly, the one or more dark current isolation regions 148 may be provided as a rectangular ring, a circular ring, a polygonal ring, or any other suitable shape as viewed looking down from a top of the electromagnetic radiation detector 100. Such a top-down view illustrating the relationship between the sidewall 124 of the additional mesa structure 106 and the one or more dark current isolation regions 148 is shown in FIG. 1B. The conduction region may be in contact with an interior portion of the additional electromagnetic radiation absorber layer 144 to define a PN junction between the additional anode layer 146 and the additional electromagnetic radiation absorber layer 144. The one or more dark current isolation regions 148 may effectively move the PN junction between these layers away from the sidewall 124 of the additional mesa structure where crystallographic defects may be concentrated. This may reduce dark current associated with the electromagnetic radiation detector 100. While referred to herein as an additional anode layer 146, those skilled in the art will appreciate that the entirety of the layer does not comprise an anode. Rather, the additional anode layer 146 contains one or more regions that form an anode, which are defined by the conduction region 150.

An anode contact 152 may be provided on a surface of the anode layer 130 opposite the buffer layer 128 between the sidewall 112 of the base structure 102 and the sidewall 118 of the mesa structure 104. In particular, the anode contact 152 may be provided over the contact region 136 in the anode layer 130 such that it is in electrical contact with the contact region 136. An additional anode contact 154 may be provided on a surface of the additional anode layer 146 opposite the additional electromagnetic radiation absorber layer 144. In particular, the additional anode contact 154 may be provided over the conduction region 150 in the additional anode layer 146 such that it is in electrical contact with the conduction region 150. The anode contact 152 and the additional anode contact 154 may comprise a metal alloy. In some embodiments, a passivation coating 156, which may include an antireflective component, may be provided on the exposed portions of the sidewall 118 of the mesa structure and the sidewall 124 of the additional mesa structure 106, as well as other exposed portions of the electromagnetic radiation detector 100. The passivation coating 156 may reduce the impact of crystallographic defects near the sidewall 118 of the mesa structure 104 and the sidewall 124 of the additional mesa structure 106 on the operation of the electromagnetic radiation detector 100.

The electromagnetic radiation detector 100 essentially provides two photodiodes coupled at the cathode. In operation, a biasing signal (i.e., voltage and/or current) may be applied between the anode contact 152 and the additional anode contact 154. As the electromagnetic radiation detector 100 is exposed to electromagnetic radiation (e.g., photons), the radiation enters the electromagnetic radiation absorber layer 140 and the additional electromagnetic radiation absorber layer 144 and generates electron-hole pairs that cause a photocurrent to flow in the device. The electromagnetic radiation absorber layer 140 and the additional electromagnetic radiation absorber layer 144 may be designed (e.g., by choosing the material, lattice constant, bandgap, thickness, etc.) to absorb certain wavelengths of light at a higher efficiency than others. In some embodiments, the electromagnetic radiation absorber layer 140 is designed to absorb electromagnetic radiation within a first frequency band and the additional electromagnetic radiation absorber layer 144 is designed to absorb electromagnetic radiation within a second frequency band. The first frequency band and the second frequency band may be overlapping or non-overlapping. Including the electromagnetic radiation absorber layer 140 and the additional electromagnetic radiation absorber layer 144 in this manner may allow for the electromagnetic radiation detector 100 to detect electromagnetic radiation within a wide frequency band.

The one or more dark current isolation regions 132 and the one or more additional dark current isolation regions 138 in the anode layer 130 may have a first conductivity type, while the conduction region 134 and the contact region 136 in the anode layer 130 may have a second conductivity type opposite the first conductivity type. In various embodiments the anode layer 130 may be provided (e.g., grown and in-situ doped) having the first conductivity type, and the conduction region 134 and the contact region 136 may be created by inverting the conductivity in these regions (e.g., via diffusion or ion implantation). However, the opposite may also be true. Similarly, the one or more dark current isolation regions 148 in the additional anode layer 146 may have the first conductivity type and the conduction region 150 in the additional anode layer 146 may have the second conductivity type. In various embodiments the additional anode layer 146 may be provided (e.g., grown and in-situ doped) having the first conductivity type, and the conduction region 150 may be created by inverting the conductivity type in this region (e.g., via diffusion or ion implantation). However, the opposite may also be true. The electromagnetic radiation absorber layer 140, the cathode layer 142, and the additional electromagnetic radiation absorber layer 144 may have the first conductivity type. The buffer layer 128 may have the second conductivity type. The substrate 126 may have the second conductivity type, or may be an undoped, intrinsic, or semi-insulting type. While FIG. 1A shows the first conductivity type as n-type and the second conductivity type as p-type for purposes of illustration, those skilled in the art will readily appreciate that the principles of the present disclosure apply equally to devices having inverted conductivity types to the ones shown.

In one embodiment, the substrate 126 comprises InP, the buffer layer 128, the anode layer 130, the cathode layer 142, and the additional anode layer 146 comprise InAsP, and the electromagnetic radiation absorber layer 140 and the additional electromagnetic radiation absorber layer 144 comprise InGaAs. However, these materials are merely exemplary. Those skilled in the art will readily appreciate that the principles of the present disclosure apply equally to electromagnetic radiation detectors including any number of material systems.

FIG. 1B shows a top-down view of some parts the electromagnetic radiation detector 100 according to one embodiment of the present disclosure. In particular, FIG. 1B shows an exemplary spatial relationship between the one or more dark current isolation regions 132 in the anode layer 130 and the sidewall 118 of the mesa structure 104. As shown, the dark current isolation regions 132 follow a perimeter of the sidewall 118 of the mesa structure 104 with a margin on either side. FIG. 1B also shows an exemplary spatial relationship between the one or more dark current isolation regions 148 in the additional anode layer 146 and the sidewall 124 of the additional mesa structure 106. As shown, the one or more dark current isolation regions 148 follow a perimeter of the sidewall 124 of the additional mesa structure 106, extending all the way to the sidewall 124. Notably, the particular shapes of the mesa structures and dark current isolation regions shown in FIG. 1B are merely exemplary. The mesa structures and corresponding dark current isolation regions may be provided in circular rings, polygonal rings, or any other suitable shape. Further, while the dark current isolation regions are shown as a single region, these may also be provided as multiple discrete regions that contact a substantial portion of the respective sidewall, rather than encompassing the entirety of the sidewall.

FIG. 1C shows the electromagnetic radiation detector 100 according to an additional embodiment of the present disclosure. The electromagnetic radiation detector 100 shown in FIG. 1C is substantially similar to that in FIG. 1A, except that a cathode contact 158 is provided. The cathode contact 158 is disposed on a surface of the cathode layer 142 opposite the electromagnetic radiation absorber layer 140 between the sidewall 118 of the mesa structure 104 and the sidewall 124 of the additional mesa structure 106. The cathode contact 158 may allow for additional control over the operation of the electromagnetic radiation detector 100, including an additional contact point for biasing and/or separate control over the photodiodes therein.

Figure 1D:
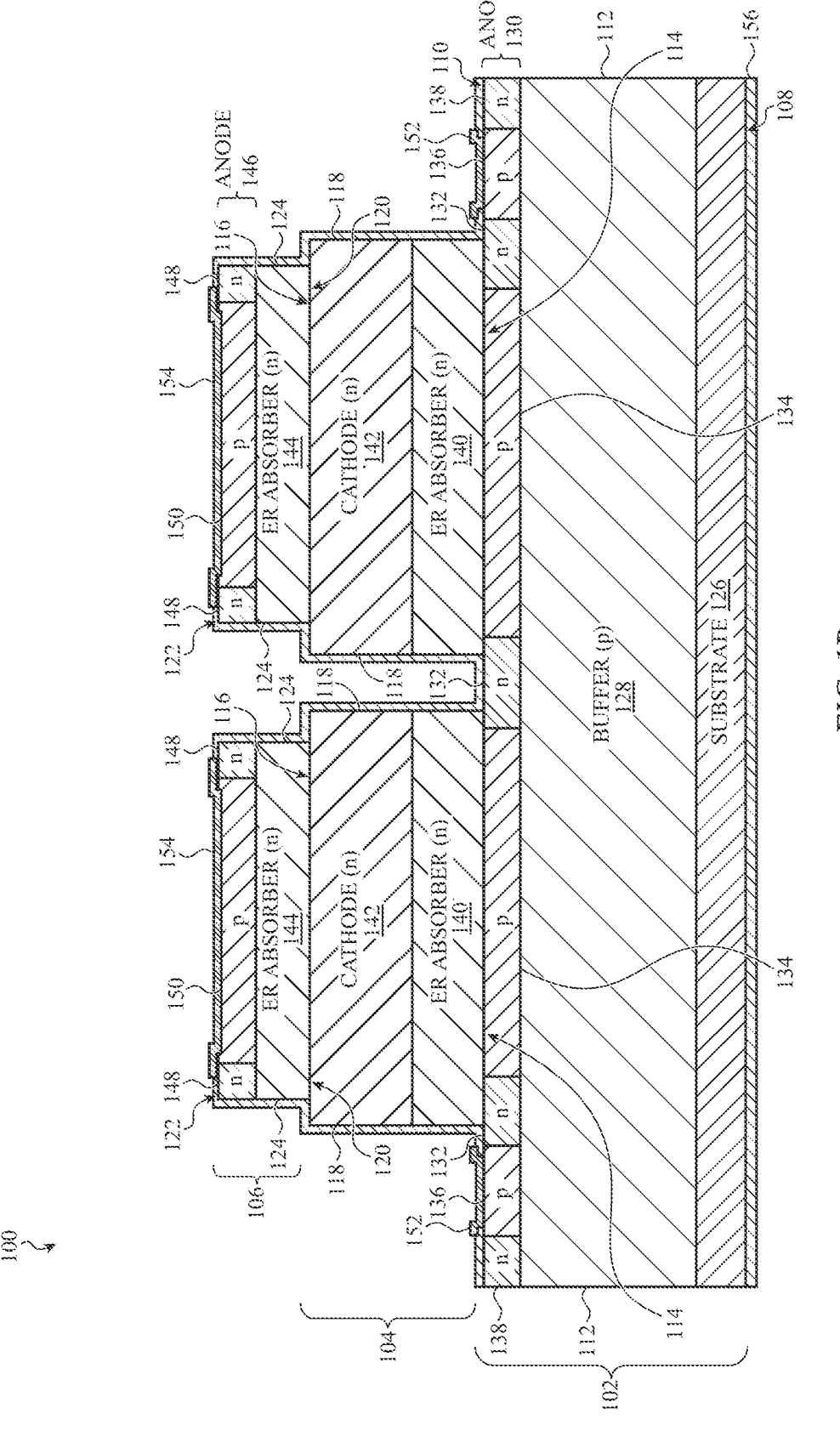
FIG. 1D illustrates a cross-sectional view of multiple integrated electromagnetic radiation detectors, such as described herein.

FIGS. 1A through 1C show an isolated electromagnetic radiation detector 100. In some cases, however, two or more electromagnetic radiation detectors 100 may be monolithically integrated, as illustrated in FIG. 1D. As shown, two electromagnetic radiation detectors 100, which are the same as described with respect to FIG. 1A, may share the substrate 126, the buffer layer 128, and the anode layer 130. Further, the electromagnetic radiation detectors 100 may share a common dark current isolation region 132 where they meet. One or more additional regions having an opposite conductivity type may also be provided between the electromagnetic radiation detectors 100. The mesa structures 104 of the electromagnetic radiation detectors 100 may be isolated from one another. The electromagnetic radiation detectors 100 may operate individually as discussed with respect to FIG. 1A, and in various embodiments may be electrically connected in different configurations (i.e., series, parallel) for different applications. While two electromagnetic radiation detectors 100 are shown in FIG. 1D for purposes of illustration, any number of electromagnetic radiation detectors 100 may be monolithically integrated with one another in a similar manner, and may tile in two or three dimensions in any desired pattern.

Figure 2:
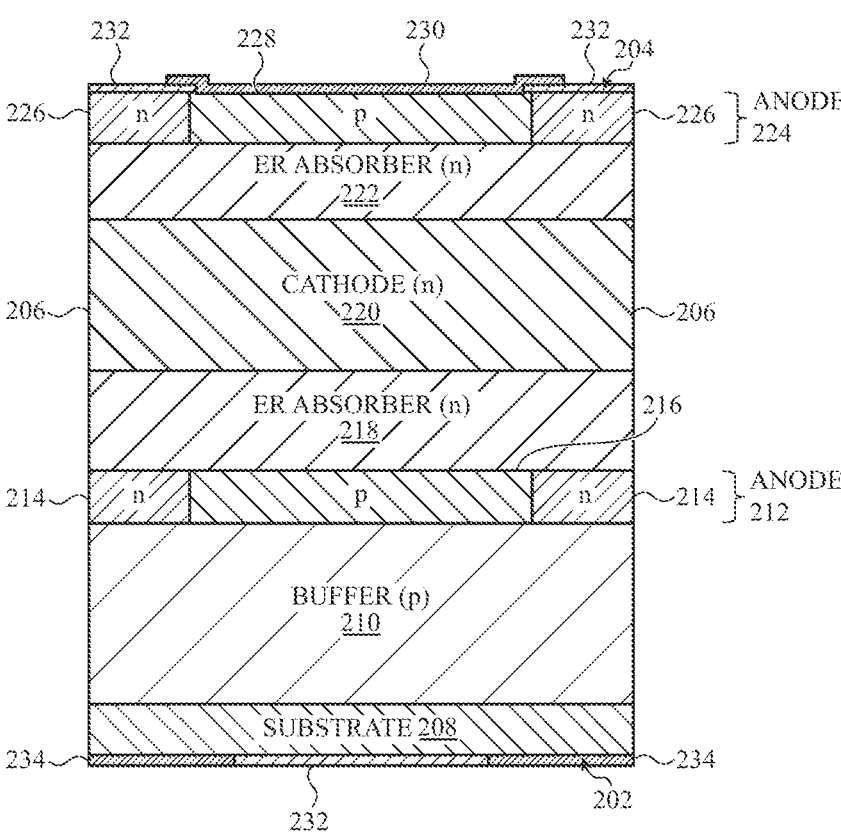
FIG. 2 illustrates a cross-sectional view of an electromagnetic radiation detector, such as described herein.

FIGS. 1A through 1D show an electromagnetic radiation detector having a mesa structure. However, electromagnetic radiation detectors may also be provided having planar structures. FIG. 2 shows a cross-sectional view of an electromagnetic radiation detector 200 having a planar structure. The electromagnetic radiation detector 200 may define a first surface 202, a second surface 204 opposite the first surface 202, and a sidewall 206 between the first surface 202 and the second surface 204. A surface of a substrate 208 (i.e., a bottom surface of the substrate 208) may define the first surface 202. An optional buffer layer 210 may be disposed on a surface of the substrate 208 opposite the first surface 202. An anode layer 212 may be disposed on a surface of the buffer layer 210 opposite the substrate 208. The buffer layer 210 may provide a transition between a lattice constant of the substrate 208 and a lattice constant of the anode layer 212. In some embodiments, the buffer layer 210 may be omitted. The anode layer 212 may include one or more dark current isolation regions 214 and a conduction region 216. The one or more dark current isolation regions 214 may be provided along the sidewall 206, and the conduction region 216 may be located in an interior portion of the anode layer 212. An electromagnetic radiation absorber layer 218 may be disposed on a surface of the anode layer 212 opposite the buffer layer 210. In particular, an interior portion of the electromagnetic radiation absorber layer 218 may be in contact with the conduction region 216 of the anode layer 212 to form a PN junction, while an outer portion of the electromagnetic radiation absorber layer 218, and in particular a portion of the electromagnetic radiation absorber layer 218 defining a portion of the sidewall 206, is in contact with the dark current isolation region 214 of the anode layer 212. The electromagnetic radiation detector 200 may be cut/singulated at the sidewall 206. This process may result in crystallographic defects at the sidewall 206, which are prone to generating dark current. The one or more dark current isolation regions 214 move the PN junction formed between the anode layer 212 and the electromagnetic radiation absorber layer 218 to an interior portion of the device away from the sidewall 206, which may reduce dark current in the device that may otherwise be caused if a depletion region were provided in this area.

A cathode layer 220 may be disposed on a surface of the electromagnetic radiation absorber layer 218 opposite the anode layer 212. An additional electromagnetic radiation absorber layer 222 may be disposed on a surface of the cathode layer 220 opposite the electromagnetic radiation absorber layer 218. An additional anode layer 224 may be disposed on a surface of the additional electromagnetic radiation absorber layer 222 opposite the cathode layer 220. The additional anode layer 224 may include one or more dark current isolation regions 226 and a conduction region 228. The one or more dark current isolation regions 226 may be provided along the sidewall 206, and the conduction region 228 may be located in an interior portion of the additional anode layer 224. An interior portion of the additional electromagnetic radiation absorber layer 222 may be in contact with the conduction region 228 of the additional anode layer 224 to form a PN junction. An outer portion of the additional electromagnetic radiation absorber layer 222, and in particular a portion of the additional electromagnetic radiation absorber layer 222 that defines a portion of the sidewall 206, is in contact with the dark current isolation region 226. As previously discussed, the dark current isolation region 226 may effectively move the PN junction between the additional anode layer 224 and the additional electromagnetic radiation absorber layer 222 to an interior portion of the device away from the sidewall 206, and thereby may reduce dark current.

Notably, the electromagnetic radiation absorber layer 218 and the additional electromagnetic radiation absorber layer 222 may have a uniform conductivity type throughout the respective layers (i.e., from sidewall 206 to sidewall 206 in the electromagnetic radiation detector 200) such that each of these layers defines a portion of the sidewall 206. While the one or more dark current isolation regions 214 in the anode layer 212 and the one or more dark current isolation regions 226 in the additional anode layer 224 are shown separated by a conduction region, each of these, respectively, may be a single region that is connected in a plane not shown in the cross-sectional view of FIG. 2. In some embodiments, the one or more dark current isolation regions 214 in the anode layer 212 and the one or more dark current isolation regions 226 in the additional anode layer 224, respectively, will contact the entirety of the sidewall 206, which is a three-dimensional structure. Accordingly, the one or more dark current isolation regions 214 in the anode layer 212 and the one or more dark current isolation regions 226 in the additional anode layer 224, respectively, may be provided as a rectangular ring, a circular ring, a polygonal ring, or any other suitable shape as viewed looking down from a top of the electromagnetic radiation detector 200.

An anode contact 230 may be disposed on a surface of the additional anode layer 224 over the conduction region 228. A passivation coating 232, which may include an anti-reflective component, may be provided on the surface of the additional anode layer 224 over the one or more dark current isolation regions 226. An additional contact 234 may be disposed on a portion of a surface of the substrate 208. The anode contact 230 and the additional contact 234 may comprise a metal alloy. The remainder of the surface of the substrate 208 may be covered in the passivation coating 232.

The electromagnetic radiation detector 200 essentially provides two photodiodes coupled at the cathode. In operation, a biasing signal (i.e., voltage and/or current) may be applied between the anode contact 230 and the additional contact 234. As the electromagnetic radiation detector 200 is exposed to electromagnetic radiation (e.g., photons), the radiation enters the electromagnetic radiation absorber layer 218 and the additional electromagnetic radiation absorber layer 222 and generates electron-hole pairs that cause a photocurrent to flow in the device. The electromagnetic radiation absorber layer 218 and the additional electromagnetic radiation absorber layer 222 may be designed (e.g., by choosing the material, lattice constant, bandgap, thickness, etc.) to absorb certain wavelengths of light at higher efficiency than others. In some embodiments, the electromagnetic radiation absorber layer 218 is designed to absorb electromagnetic radiation within a first frequency band and the additional electromagnetic radiation absorber layer 222 is designed to absorb electromagnetic radiation in a second frequency band. The first frequency band and the second frequency band may be overlapping or non-overlapping. Including the electromagnetic radiation absorber layer 218 and the additional electromagnetic radiation absorber layer 222 in this manner may allow for the electromagnetic radiation detector to detect electromagnetic radiation in a wide frequency band.

The one or more dark current isolation regions 214 in the anode layer 212 may have a first conductivity type, while the conduction region 216 in the anode layer 212 may have a second conductivity type opposite the first conductivity type. In various embodiments the anode layer 212 may be provided (e.g., grown and in-situ doped) having the first conductivity type, and the conduction region 216 may be created by inverting the conductivity type in this region (e.g., via diffusion or ion implantation). However, the opposite may also be true. Similarly, the one or more dark current isolation regions 226 in the additional anode layer 224 may have the first conductivity type, while the conduction region 228 in the additional anode layer 224 may have the second conductivity type. In various embodiments the additional anode layer 224 may be provided (e.g., grown and in-situ doped) having the first conductivity type, and the conduction region 228 may be created by inverting the conductivity type in this region (e.g., via diffusion or ion implantation).

However, the opposite may also be true. The electromagnetic radiation absorber layer 218, the cathode layer 220, and the additional electromagnetic radiation absorber layer 222 may have the first conductivity type. The buffer layer 210 may have the second conductivity type. The substrate 208 may have the second conductivity type, or may be an undoped, intrinsic, or semi-insulating layer. While FIG. 2 shows the first conductivity type as n-type and the second conductivity type as p-type for purposes of illustration, those skilled in the art will readily appreciate that the principles of the present disclosure apply equally to devices having inverted conductivity types to the ones shown.

In one embodiment, the substrate 208 comprises InP, the buffer layer 210, the anode layer 212, the cathode layer 220, and the additional anode layer 224 comprise InAsP, and the electromagnetic radiation absorber layer 218 and the additional electromagnetic radiation absorber layer 222 comprise InGaAs. However, these materials are merely exemplary. Those skilled in the art will readily appreciate that that principles of the present disclosure apply equally to electromagnetic radiation detectors including any number of material systems.

FIG. 3 is a flow diagram illustrating a method 300 for manufacturing an electromagnetic radiation detector according to one embodiment of the present disclosure. For purposes of illustration, FIG. 3 illustrates a method for manufacturing the electromagnetic radiation detector 100 discussed with respect to FIG. 1A, however, those skilled in the art will readily appreciate the applicability of the method to other embodiments discussed herein. FIGS. 4A through 4L illustrate each of the steps of the method 300. A base structure 102 may be provided. Providing the base structure 102 may include providing the substrate 126 (step 302 and FIG. 4A), optionally providing the buffer layer 128 on the substrate 126 (step 304 and FIG. 4B), and providing the anode layer 130 on the buffer layer 128 (step 306 and FIG. 4C). The substrate 126, the buffer layer 128, and the anode layer 130 may be provided by any suitable processes, such as, for example, a growth process or a deposition process.

A conductivity type of one or more regions in the anode layer 130 may be inverted (step 308 and FIG. 4D). In particular, the conductivity type of the one or more regions in the anode layer 130 may be inverted such that the anode layer 130 includes and defines the one or more dark current isolation regions 132, the conduction region 134, the contact region 136, and the one or more additional dark current isolation regions 138. As discussed with respect to FIG. 1A, the one or more dark current isolation regions 132 and the one or more additional dark current isolation regions 138 may have a first conductivity type, while the conduction region 134 and the contact region 136 may have a second conductivity type opposite the first conductivity type. In some embodiments the anode layer 130 may be provided having the first conductivity type, and the conductivity type of the conduction region 134 and the contact region 136 may be inverted. However, the opposite may also be true, wherein the anode layer 130 may be provided having the second conductivity type and the conductivity type of the one or more dark current isolation regions 132 and the one or more additional dark current isolation regions 138 may be inverted. The conductivity type of the one or more regions in the anode layer 130 may be inverted by any suitable process, such as via a diffusion doping process or an ion implantation process. In various embodiments, inverting the conductivity type of the one or more regions in the anode layer 130 may include providing a patterned mask on a surface of the anode layer 130 opposite the buffer layer 128, introducing a dopant into the anode layer 130 via one or more openings in the patterned mask to invert the conductivity type of the regions below the one or more openings (e.g., via diffusion or ion implantation), and subsequently removing the patterned mask. Details of such a process will be readily appreciated by those skilled in the art and thus are not discussed in detail herein. Notably, the conductivity type of the one or more regions in the anode layer 130 may be inverted before the electromagnetic radiation absorber layer 140 is provided on the anode layer 130. The result is that the electromagnetic radiation absorber layer 140 maintains a consistent conductivity type throughout, from sidewall 118 to sidewall 118 of the mesa structure 104.

A mesa layer stack may be provided on the base structure. Providing the mesa layer stack may include providing the electromagnetic radiation absorber layer 140 on the anode layer 130 (step 310 and FIG. 4E), and providing the cathode layer 142 on the electromagnetic radiation absorber layer 140 (step 312 and FIG. 4F). In instances where the electromagnetic radiation detector includes multiple mesa layer stacks, an additional mesa layer stack may be provided on the mesa layer stack. Providing the additional mesa layer stack may include providing the additional electromagnetic radiation absorber layer 144 on the cathode layer 142 (step 314 and FIG. 4G), and providing the additional anode layer 146 on the additional electromagnetic radiation absorber layer 144 (step 316 and FIG. 4H).

Figure 4F:
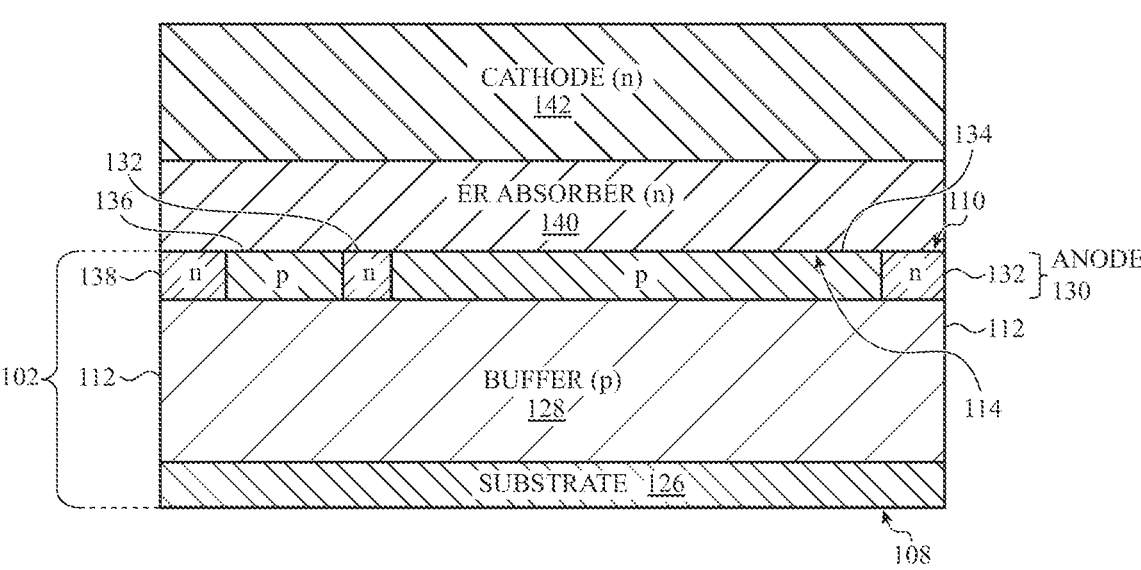
Figure 4G:
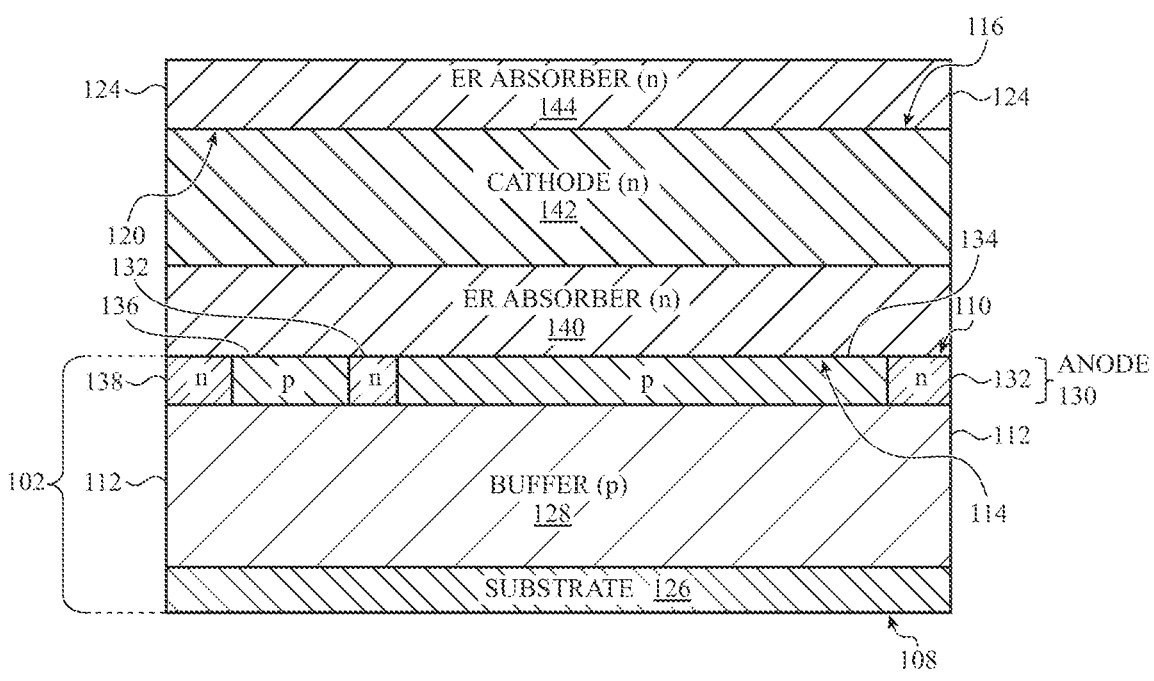
Figure 4H:
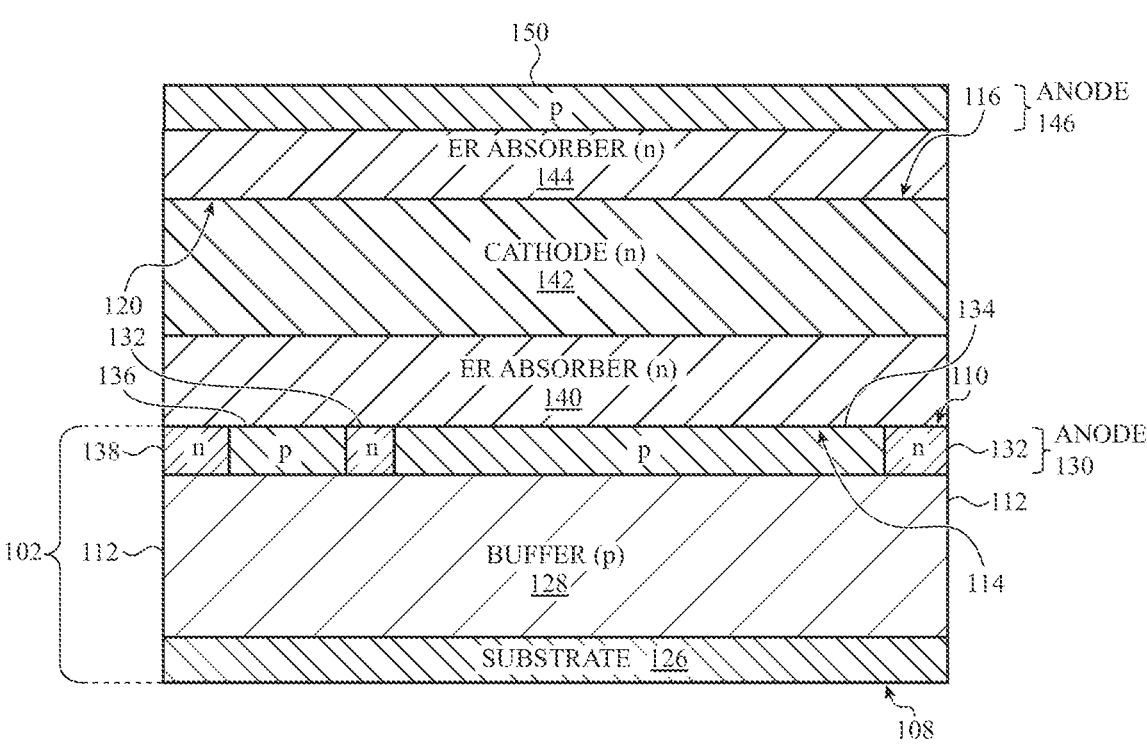
Figure 4I:
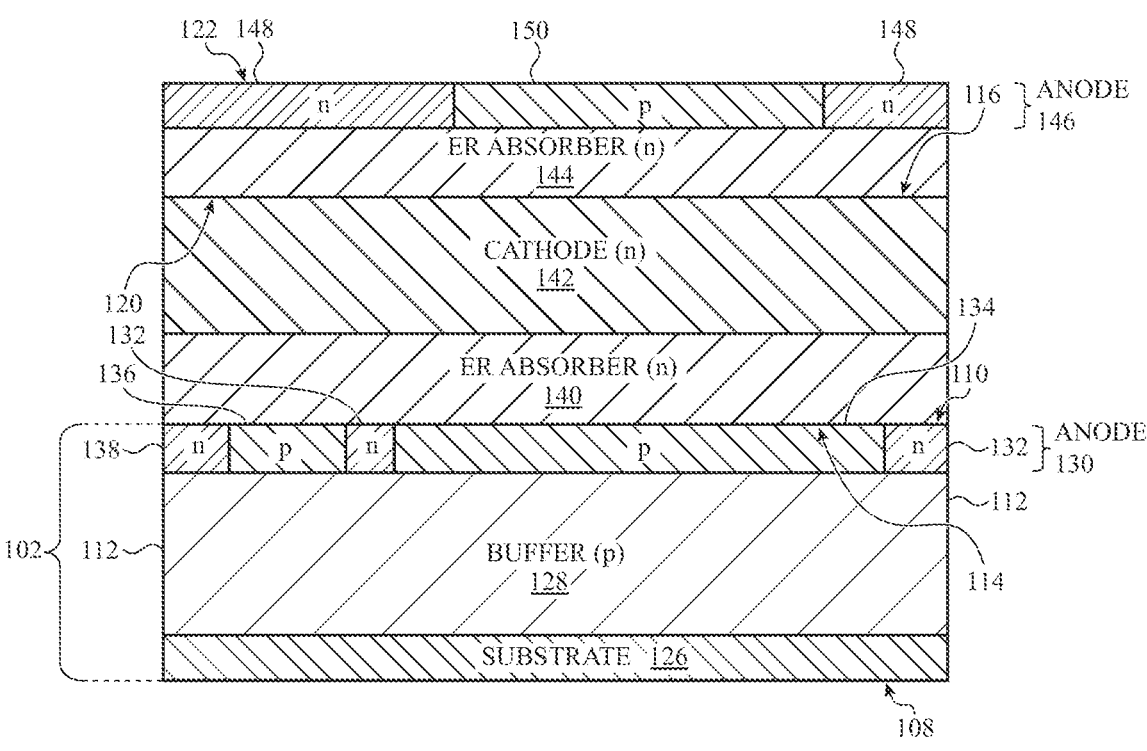

A conductivity type of one or more regions in the additional anode layer 146 may be inverted (step 318 and FIG. 4I). In particular, the conductivity type of the one or more regions in the additional anode layer 146 may be inverted such that the additional anode layer includes the one or more dark current isolation regions 148 and the conduction region 150. As discussed with respect to FIG. 1A, the one or more dark current isolation regions 148 may have the first conductivity type and the conduction region 150 may have the second conductivity type. In some embodiments the additional anode layer 146 may be provided having the first conductivity type and the conductivity type of the conduction region 150 may be inverted. However, the opposite may also be true, wherein the additional anode layer 146 may be provided having the second conductivity type and the conductivity type of the one or more dark current isolation regions 148 may be inverted. The conductivity type of the one or more regions in the additional anode layer 146 may be inverted by any suitable process, such as a diffusion doping process or an ion implantation process. In various embodiments, inverting the conductivity type of the one or more regions in the additional anode layer 146 may include providing a patterned mask on a surface of the additional anode layer 146, introducing a dopant into the additional anode layer 146 via one or more openings in the patterned mask layer to invert a conductivity type of the regions below the one or more openings (e.g., via diffusion or ion implantation), and subsequently removing the patterned mask. Details of such a process will be readily apparent to those skilled in the art and thus are not discussed in detail herein. Notably, inverting the conductivity type of the one or more regions in the additional anode layer 146 may be done so that it does not affect the conductivity type of the additional electromagnetic radiation absorber layer 144. The result is that the additional electromagnetic radiation absorber layer 144 maintains a consistent conductivity type throughout, from sidewall 124 to sidewall 124 of the additional mesa structure 106.

Figure 4J:
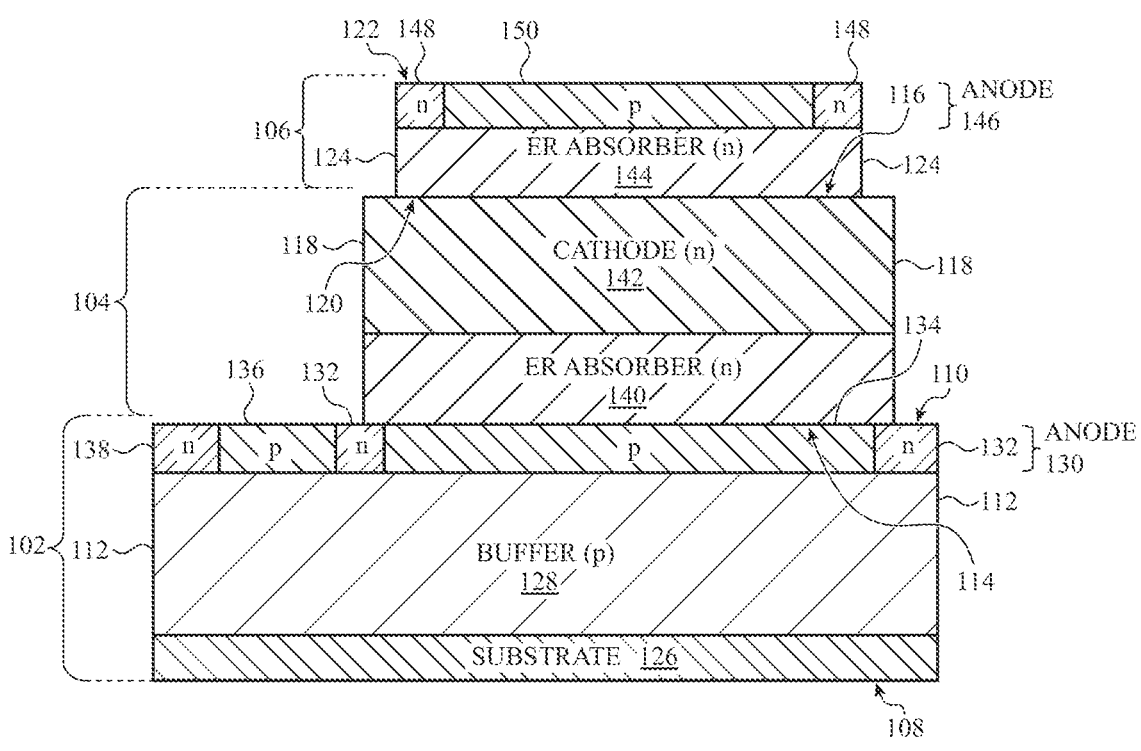
Figure 4L:
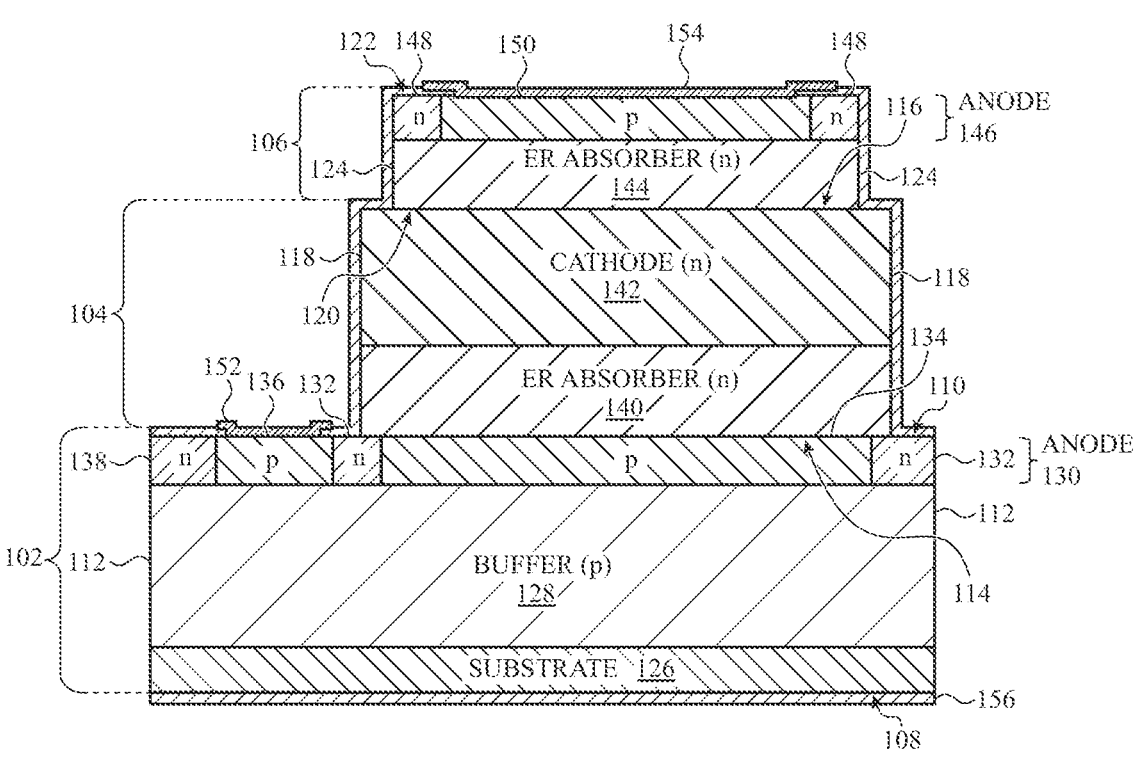

The mesa layer stack and the additional mesa layer stack may be patterned to form the mesa structure 104 and the additional mesa structure 106 (step 320 and FIG. 4J). The patterning may be accomplished in any suitable manner including any number of steps. For example, a first etching step may be used to provide the additional mesa structure 106 and a second etching step may be used to provide the mesa structure 104. As discussed above, the dark current isolation regions 132 and the additional dark current isolation regions 138 in the anode layer 130, as well as the dark current isolation regions 148 in the additional anode layer 146 may reduce dark current that would otherwise result from crystalline defects introduced by such an etching process by moving the PN junction between the anode layer 130 and the electromagnetic radiation absorber layer 140 and the PN junction between the additional anode layer 146 and the additional electromagnetic radiation absorber layer 144, respectively, away from the etched sidewalls. The passivation coating 156, which may include an antireflective component, may be provided on exposed portions of the electromagnetic radiation detector 100, including the sidewall 118 of the mesa structure 104 and the sidewall 124 of the additional mesa structure 106 (step 322 and FIG. 4K). The passivation coating 156 may be provided using any suitable process, such as a deposition process. The anode contact 152 and the additional anode contact 154 may be provided (step 324 and FIG. 4L). The anode contact 152 and the additional anode contact 154 may be provided using any suitable process, such as a deposition process.

Figure 5A:
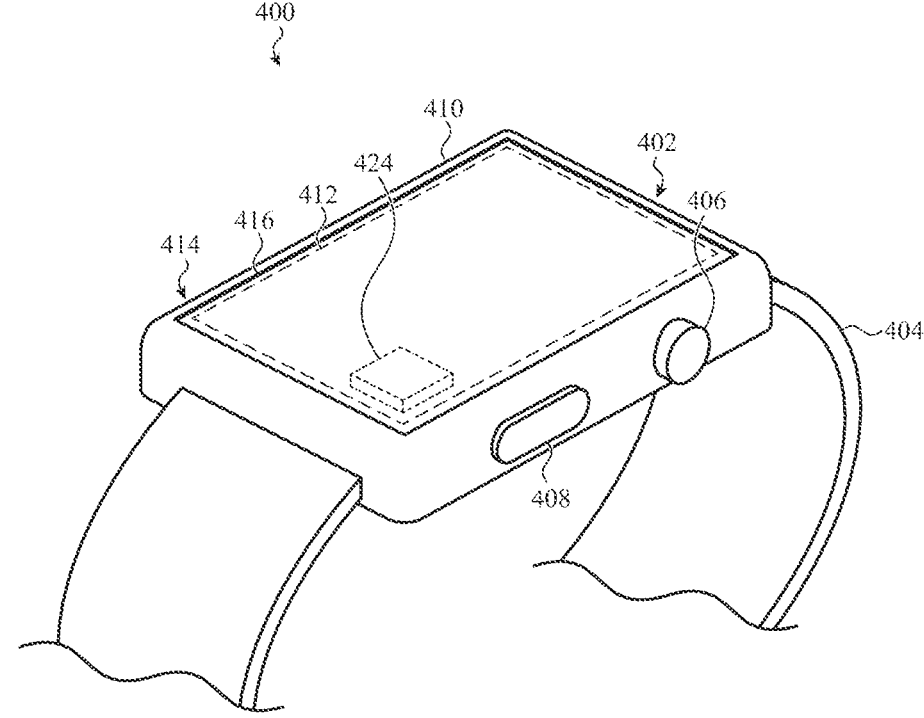
FIGS. 5A and 5B illustrate a wearable device that may include an electromagnetic radiation detector, such as described herein.
Figure 5B:
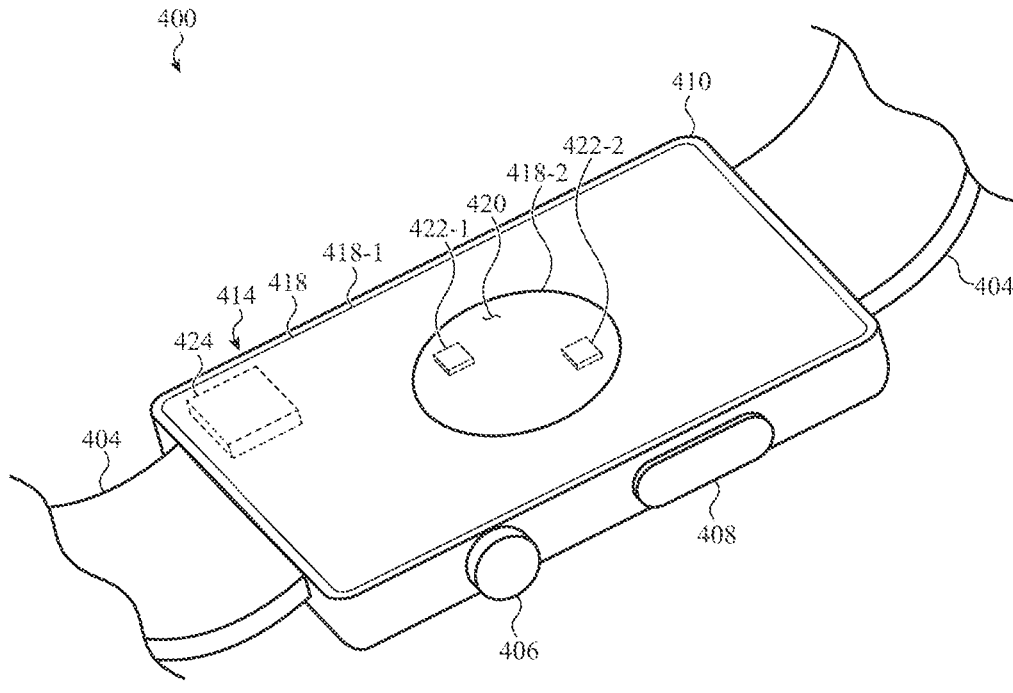

FIGS. 5A and 5B show an example of a wearable device 400 that may incorporate one or more sensors, including one or more electromagnetic radiation sensors as discussed herein. Specifically, FIG. 5A shows a front isometric view of the wearable device 400, while FIG. 5B shows a back isometric view of the wearable device 400. The sensors of the wearable device 400 may be used, for example, to acquire biometric data from a user (e.g., heart rate, respiration rate, blood pressure, blood flow rate, blood oxygenation), or to determine a status of the wearable device 400 (e.g., whether the wearable device is being worn, one or more ambient environmental conditions). While the wearable device 400 is shown having the form factor of a watch, the wearable device 400 could by any suitable type of wearable device having any form factor. Further, the principles of the present disclosure apply equally to non-wearable devices such as smartphones, tablets, laptop computers, desktop computers, and the like.

The wearable device 400 includes a body 402 (e.g., a watch body) and a band 404. The body 402 may include an input or selection device, such as a crown 406 or a button 408. The band 404 may be attached to a housing 410 of the body 402, and may be used to attach the body 402 to a body part of a user (e.g., an arm, wrist, leg, ankle, or waist). The housing 410 may at least partially surround a display 412. In some embodiments, the housing 410 may include a sidewall 414, which may support a front cover 416 (shown in FIG. 5A) and/or a back cover 418 (shown in FIG. 5B). The front cover 416 may be positioned over the display 412, and may provide a window through which the display 412 is viewed. In some embodiments, the display 412 may be attached to (or about) the sidewall 414 and/or the front cover 416. In other embodiments, the display 412 may not be included and/or the housing 410 may have an alternative configuration.

The display 412 may include one or more light emitting elements including, for example, light-emitting elements that define a light-emitting diode (LED) display, an organic LED (OLED) display, a liquid crystal display (LCD), an electroluminescent (EL) display, or any other type of display. In some embodiments, the display 412 may include, or be associated with, one or more touch and/or force sensors that are configured to detect touch and/or force applied to the front cover 416.

In some embodiments, the sidewall 414 of the housing 410 may be formed using one or more metals (e.g., aluminum or stainless steel), polymers (e.g., plastics), ceramics, or composites (e.g., carbon fiber). The front cover 416 may be formed, for example, using one or more of glass, a crystal (e.g., sapphire), or a transparent polymer (e.g., plastic) that enables a user to view the display 412 through the front cover 416. In some cases, a portion of the front cover 416 (e.g., a perimeter portion of the front cover 416) may be coated in an opaque ink to obscure components included within the housing 410. In some cases, all of the exterior components may be formed of a transparent material, and the components of the wearable device 400 may or may not be obscured by an opaque ink or opaque structure within the housing 410.

The back cover 418 may be formed using the same material or materials used to form the sidewall 414 and/or the front cover 416. In some cases, the back cover 418 may be part of a monolithic element that also forms the sidewall 414. In other cases, and as shown, the back cover 418 may be a multi-part back cover, such as a back cover having a first back cover portion 418-1 attached to the sidewall 414 and a second back cover portion 418-2 attached to the first back cover portion 418-1. The second back cover portion 418-2 may in some embodiments have a circular perimeter and an arcuate exterior surface 420 (i.e., an exterior surface 420 having an arcuate profile).

The front cover 416, the back cover 418, and the first back cover portion 418-1 may be mounted to the sidewall 414 using fasteners, adhesives, seals, gaskets, or other components. The second back cover portion 418-2, when present, may be mounted to the first back cover portion 418-1 using fasteners, adhesives, seals, gaskets, or other components.

A display stack or device stack (hereinafter referred to as a "stack") including the display 412 may be attached (or abutted) to an interior surface of the front cover 416 and extend into an interior volume of the wearable device 400. In some cases, the stack may include a touch sensor (e.g., a grid of capacitive, resistive, strain based, ultrasonic, or other type of touch sensing elements), or other layers of optical, mechanical, electrical, or other types of components. In some cases, the touch sensor (or part of a touch sensor system) may be configured to detect a touch applied to an outer surface of the front cover 416 (e.g., to a display surface of the wearable device 400).

The wearable device 400 may include various sensors 422. For purposes of illustration, the wearable device 400 is shown having a first sensor 422-1 and a second sensor 422-2. The first sensor 422-1 may be an electromagnetic radiation detector as discussed herein, and may be used to sense various physical phenomena such as a proximity of the wearable device 400 to a user or biometric data about the user. The second sensor 422-2 may be a different type of sensor such as a temperature sensor, which may be used to sense the same or different data as the first sensor 422-1. The wearable device 400 may include circuitry 424 (e.g., processing circuitry and/or other components) configured to determine or extract, at least partly in response to signals received directly or indirectly from sensors therein (e.g., the first sensor 422-1 and the second sensor 422-2), data about the user (e.g., biometric data), a status of the wearable device 400, and/or data about the environment surrounding the wearable device 400. In doing so, the circuitry 424 may process signals from sensors therein using any suitable transformations, approximations, mathematical operations, and/or machine learning models. In some embodiments, the circuitry 424 may be configured to convey the determined or extracted parameters or statuses to a user of the wearable device 400. For example, the circuitry 424 may cause the indication or indications to be displayed on the display 412, indicated via audio or haptic outputs, transmitted via a wireless communications interface or other communications interface, and so on. The circuitry 424 may also or alternatively maintain or alter one or more settings, functions, or embodiments of the wearable device 400, including, in some cases, what is displayed on the display 412.

To illustrate a more general functional device that may include one or more electromagnetic radiation sensors as discussed herein, FIG. 6 shows a sample electrical block diagram of a device 500. The device 500 may include a display 502 (e.g., a light-emitting display), a processor 504, (also referred to herein as processing circuitry), a power source 506, a memory 508, or storage device, a sensor system 510, and an input/output (I/O) mechanism 512 (e.g., an I/O device, an I/O port, or a haptic I/O interface). The processor 504 may communicate, either directly or indirectly, with some or all of the other components of the device 500. For example, a system bus or other communication mechanism 514 can provide communication between the display 502, the processor 504, the power source 506, the memory 508, the sensor system 510, and the I/O mechanism 512.

The processor 504 may be implemented as any electronic device capable of processing, receiving, or transmitting data or instructions, whether such data or instructions is in the form of software or firmware or otherwise encoded. For example, the processor 504 may include a microprocessor, a central processing unit (CPU), an application-specific integrated circuit (ASIC), a digital signal processor (DSP), a controller, or a combination of such devices. As described herein, the term "processor" or "processing circuitry" is meant to encompass a single processing unit, multiple processors, multiple processing units, or other suitably configured computing element or elements.

It should be noted that the components of the device 500 can be controlled by multiple processors. For example, select components of the device 500 (e.g., the sensor system 510) may be controlled by a first processor and other components of the wearable device (e.g., the display 502) may be controlled by a second processor, where the first and second processors may or may not be in communication with each other.

The power source 506 can be implemented with any device capable of providing energy to the device 500. For example, the power source 506 may include one or more batteries or rechargeable batteries. Additionally or alternatively, the power source 506 may include a power connector or power cord that connects the device 500 to another power source, such as a wall outlet.

The memory 508 may store electronic data that can be used by the device 500. For example, the memory 508 may store electrical data or content such as, for example, audio and video files, documents and applications, device settings and user preferences, timing signals, control signals, and data structures and databases. The memory 508 may include any type of memory. By way of example only, the memory 508 may include random access memory (RAM), read-only memory (ROM), flash memory, removeable memory, other types of storage elements, or combinations of such memory types.

The device 500 may also include one or more sensor systems 510 positioned almost anywhere thereon. For example, the sensor system may include one or more electromagnetic radiation detectors as discussed in FIGS. 1A through 2. The sensor system 510 may be configured to sense one or more types of parameters, such as but not limited to: vibration, light, touch, force, heat, movement, relative motion, biometric data (e.g., biological parameters) of a user, air quality, proximity, position, or connectedness. By way of example, the sensor system 510 may include one or more electromagnetic radiation detectors as discussed in FIGS. 1A through 2, a heat sensor, a position sensor, a light or optical sensor, an accelerometer, a pressure transducer, a gyroscope, a magnetometer, a health monitoring sensor, and/or an air quality sensor. Additionally, the one or more sensor system 510 may utilize any suitable sensing technology including, but not limited to, interferometric, magnetic, capacitive, ultrasonic, resistive, optical, acoustic, piezoelectric, or thermal technologies.

The I/O mechanism 512 may transmit or receive data from a user or another electronic device. The I/O mechanism 512 may include the display 502, a touch sensing input surface, a crown, one or more buttons (e.g., a graphical user interface "home" button), one or more cameras (including an under-display camera), one or more microphones or speakers, one or more ports such as a microphone port, and/or a keyboard. Additionally or alternatively, the I/O mechanism 512 may transmit electronic signals via a communications interface, such as a wireless, wired, and/or optical communications interface. Examples of wireless and wired communications interfaces include, but are not limited to, cellular and Wi-Fi communications interfaces.

These foregoing embodiments depicted in FIGS. 1A through 6 and the various alternatives thereof and variations thereto are presented, generally, for purposes of explanation, and to facilitate an understanding of various configurations and constructions of a system, such as described herein. However, it will be apparent to one skilled in the art that some of the specific details presented herein may not be required in order to practice a particular described embodiment, or an equivalent thereof.

Thus, it is understood that the foregoing and following descriptions of specific embodiments are presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

As used herein, the phrase "at least one of" preceding a series of items, with the term "and" or "or" to separate any of the items, modifies the list as a whole, rather than each member of the list. The phrase "at least one of" does not require selection of at least one of each item listed; rather, the phrase allows a meaning that includes at a minimum one of any of the items, and/or at a minimum one of any combination of the items, and/or at a minimum one of each of the items. By way of example, the phrases "at least one of A, B, and C" or "at least one of A, B, or C" each refer to only A, only B, or only C; any combination of A, B, and C; and/or one or more of each of A, B, and C. Similarly, it may be appreciated that an order of elements presented for a conjunctive or disjunctive list provided herein should not be construed as limiting the disclosure to only that order provided.

One may appreciate that although many embodiments are disclosed above, that the operations and steps presented with respect to methods and techniques described herein are meant as exemplary and accordingly are not exhaustive. One may further appreciate that alternate step order or fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

What is claimed is:

1. A method for manufacturing an electromagnetic radiation detector, comprising:
providing a base structure defining a first surface of the base structure, a second surface of the base structure opposite the first surface of the base structure, and a sidewall between the first surface and the second surface of the base structure, wherein providing the base structure comprises:
providing an anode layer defining the second surface of the base structure; and
inverting a conductivity type of one or more regions in the anode layer such that the anode layer comprises:
a dark current isolation region having a first conductivity type; and
a conduction region having a second conductivity type opposite the first conductivity type; and
after inverting the conductivity type of the one or more regions in the anode layer, providing a mesa layer stack on the base structure, wherein providing the mesa layer stack comprises providing an electromagnetic radiation absorber layer having the first conductivity type on the second surface of the base structure; and
patterning the mesa layer stack to provide a mesa structure, the mesa structure defining a first surface of the mesa structure disposed on the second surface of the base structure, a second surface of the mesa structure opposite the first surface of the mesa structure, and a sidewall between the first surface and the second surface of the mesa structure, wherein:
the electromagnetic radiation absorber layer defines the first surface of the mesa structure and a portion of the sidewall of the mesa structure;
the sidewall of the mesa structure is in contact with the dark current isolation region of the anode layer at the second surface of the base structure; and
an interior portion of the mesa structure is in contact with the conduction region of the anode layer at the second surface of the base structure.

2. The method of claim 1, wherein inverting the conductivity type of the one or more regions in the anode layer comprises:
providing a patterned mask on a surface of the anode layer;
introducing a dopant into the anode layer through one or more openings in the patterned mask to invert the conductivity type of the one or more regions; and removing the patterned mask from the surface of the anode layer.

3. The method of claim 2, wherein introducing the dopant into the anode layer through the one or more openings in the patterned mask comprises one or more of an ion implantation process and a diffusion doping process.

4. The method of claim 2, wherein the conductivity type of the one or more regions in the anode layer is inverted such that the anode layer further comprises a contact region adjacent the dark current isolation region between the sidewall of the base structure and the sidewall of the mesa structure, the contact region having the second conductivity type.

5. The method of claim 4, wherein the conductivity type of the one or more regions in the anode layer is inverted such that the anode layer further comprises an additional dark current isolation region between the contact region and the sidewall of the base structure, the additional dark current isolation region having the first conductivity type.

6. The method of claim 5, wherein:
providing the mesa layer stack further comprises providing a cathode layer on a surface of the electromagnetic radiation absorber layer opposite the base structure, the cathode layer defining the second surface of the mesa structure and having the first conductivity type; and
providing the base structure further comprises:
providing a substrate, the substrate defining the first surface of the base structure and having the second conductivity type; and
providing a buffer layer on a surface of the substrate opposite the first surface of the base structure, wherein:
the anode layer is provided on a surface of the buffer layer such that the buffer layer is between the substrate and the anode layer; and
the buffer layer has the second conductivity type.

7. The method of claim 6, further comprising:
providing an additional mesa layer stack on the second surface of the mesa structure, wherein providing the additional mesa layer stack comprises:
providing an additional electromagnetic radiation absorber layer on the second surface of the mesa structure, the additional electromagnetic radiation absorber layer having the first conductivity type; and
providing an additional anode layer on a surface of the additional electromagnetic radiation absorber layer opposite the mesa structure; and
patterning the additional mesa layer stack to provide an additional mesa structure, the additional mesa structure defining a first surface disposed on the second surface of the mesa structure, a second surface opposite the first surface, and a sidewall between the first surface and the second surface.

8. The method of claim 7, further comprising inverting a conductivity type of one or more regions in the additional anode layer such that the additional anode layer comprises:
a dark current isolation region in contact with the sidewall of the additional mesa structure, the dark current isolation region having the first conductivity type; and
a conduction region in contact with an interior portion of the additional electromagnetic radiation absorber layer, the conduction region having the second conductivity type.

9. The method of claim 8, wherein:
the substrate comprises indium phosphide (InP);

the buffer layer, the anode layer, the cathode layer, and the additional anode layer comprise indium arsenide phosphide (InAsP); and the electromagnetic radiation absorber layer and the additional electromagnetic radiation absorber layer comprise indium gallium arsenide (InGaAs).

10. An electromagnetic radiation detector, comprising:

a mesa structure defining a first surface, a second surface opposite the first surface, and a sidewall between the first surface and the second surface, the mesa structure comprising:

an electromagnetic radiation absorber layer defining the first surface of the mesa structure and a portion of the sidewall of the mesa structure, the electromagnetic radiation absorber layer having a first conductivity type; and a base structure defining a first surface, a second surface opposite the first surface, and a sidewall between the first surface and the second surface, wherein the first surface of the mesa structure is disposed on the second surface of the base structure and the base structure comprises:

an anode layer defining the second surface of the base structure, the anode layer comprising:

a dark current isolation region in contact with the sidewall of the mesa structure at the second surface of the base structure, the dark current isolation region having the first conductivity type; and a conduction region in contact with an interior portion of the mesa structure at the second surface of the base structure, the conduction region having a second conductivity type opposite the first conductivity type.

11. The electromagnetic radiation detector of claim 10 wherein the anode layer further comprises a contact region adjacent the dark current isolation region between the sidewall of the base structure and the sidewall of the mesa structure, the contact region having the second conductivity type.

12. The electromagnetic radiation detector of claim 11 further comprising an additional dark current isolation region between the contact region and the sidewall of the base structure, the additional dark current isolation region having the first conductivity type.

13. The electromagnetic radiation detector of claim 12 wherein:

the mesa structure further comprises a cathode layer disposed on a surface of the electromagnetic radiation absorber layer opposite the base structure and defining the second surface of the mesa structure, the cathode layer having the first conductivity type; and the base structure further comprises:

a substrate defining the first surface of the base structure and having the second conductivity type; and a buffer layer between the substrate and the anode layer, the buffer layer having the second conductivity type.

14. The electromagnetic radiation detector of claim 13 further comprising an additional mesa structure defining a first surface disposed on the second surface of the mesa structure, a second surface opposite the first surface, and a sidewall between the first surface and the second surface, the additional mesa structure comprising:

an additional electromagnetic radiation absorber layer defining the first surface of the additional mesa structure, the additional electromagnetic radiation absorber layer having the first conductivity type; and

an additional anode layer disposed on a surface of the additional electromagnetic radiation absorber layer opposite the mesa structure and defining the second surface of the additional mesa structure, the additional anode layer comprising:

a dark current isolation region in contact with the sidewall of the additional mesa structure, the dark current isolation region having the first conductivity type; and a conduction region in contact with an interior portion of the additional electromagnetic radiation absorber layer, the conduction region having the second conductivity type.

15. The electromagnetic radiation detector of claim 14 wherein:

the substrate comprises indium phosphide (InP);

the buffer layer, the anode layer, the cathode layer, and the additional anode layer comprise indium arsenide phosphide (InAsP); and the electromagnetic radiation absorber layer and the additional electromagnetic radiation absorber layer comprise indium gallium arsenide (InGaAs).

16. A method for manufacturing an electromagnetic radiation detector defining a first surface, a second surface opposite the first surface, and a sidewall between the first surface and the second surface, the method comprising:

providing an anode layer;

inverting a conductivity type of one or more regions in the anode layer such that the anode layer comprises:

a dark current isolation region in contact with the sidewall, the dark current isolation region having a first conductivity type; and a conduction region in an interior portion of the anode layer, the conduction region having a second conductivity type opposite the first conductivity type; and after inverting the conductivity type of the one or more regions in the anode layer, providing an electromagnetic radiation absorber layer on a surface of the anode layer, the electromagnetic radiation absorber layer defining at least a portion of the sidewall and being in contact with the conduction region of the anode layer and having the first conductivity type.

17. The method of claim 16, wherein inverting the conductivity type of the one or more regions in the anode layer comprises:

providing a patterned mask on a surface of the anode layer;

introducing a dopant into the anode layer through one or more openings in the patterned mask to invert the conductivity type of the one or more regions; and removing the patterned mask from the surface of the anode layer.

18. The method of claim 17, further comprising:

providing a substrate having the second conductivity type, the substrate defining the first surface;

providing a buffer layer on a surface of the substrate opposite the first surface, wherein:

the anode layer is provided on a surface of the buffer layer such that the buffer layer is between the substrate and the anode layer; and the buffer layer has the second conductivity type;

providing a cathode layer on a surface of the electromagnetic radiation absorber layer opposite the anode layer, the cathode layer having the first conductivity type;

providing an additional electromagnetic radiation absorber layer on a surface of the cathode layer opposite the electromagnetic radiation absorber layer, the additional electromagnetic radiation absorber layer having the first conductivity type; and providing an additional anode layer on a surface of the additional electromagnetic radiation absorber layer opposite the cathode layer.

19. The method of claim 18, further comprising inverting a conductivity type of one or more regions in the additional anode layer such that the additional anode layer comprises:

a dark current isolation region in contact with the sidewall, the dark current isolation region having the first conductivity type; and a conduction region in contact with an interior portion of the additional electromagnetic radiation absorber layer, the conduction region having the second conductivity type.

20. The method of claim 19, wherein:

the substrate comprises indium phosphide (InP);

the buffer layer, the anode layer, the cathode layer, and the additional anode layer comprise indium arsenide phosphide (InAsP); and the electromagnetic radiation absorber layer and the additional electromagnetic radiation absorber layer comprise indium gallium arsenide (InGaAs).

\* \* \* \* \*